United States Patent
Koga et al.

(10) Patent No.: US 7,649,766 B2
(45) Date of Patent: Jan. 19, 2010

(54) MAGNETIC STORAGE DEVICE

(75) Inventors: Keiji Koga, Tokyo (JP); Katsumichi Tagami, Tokyo (JP); Tohru Oikawa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/002,253

(22) Filed: Dec. 14, 2007

(65) Prior Publication Data
US 2008/0144227 A1 Jun. 19, 2008

(30) Foreign Application Priority Data
Dec. 15, 2006 (JP) .............................. 2006-337692

(51) Int. Cl.
*G11C 11/00* (2006.01)
(52) U.S. Cl. ..................... 365/158; 365/148; 365/171
(58) Field of Classification Search ................ 365/171, 365/173, 158, 131, 66; 257/421, E21.665; 438/3; 977/933, 934, 935
See application file for complete search history.

(56) References Cited

U.S. PATENT DOCUMENTS

| | | |
|---|---|---|
| 6,924,965 B2 | 8/2005 | Babich |
| 6,960,815 B2 | 11/2005 | Yoda et al. |
| 7,113,385 B2 | 9/2006 | Babich |
| 2002/0034094 A1* | 3/2002 | Saito et al. .................. 365/158 |
| 2004/0021189 A1* | 2/2004 | Yoda et al. ................... 257/421 |
| 2005/0018478 A1* | 1/2005 | Nagase et al. ............... 365/171 |

FOREIGN PATENT DOCUMENTS

| | | |
|---|---|---|
| JP | 2000-090658 A | 3/2000 |
| JP | 3466470 B2 | 8/2003 |
| JP | 2004-128430 A | 4/2004 |

OTHER PUBLICATIONS http://www.shinetsu-rare-earth-magnet.jp/e/design/words/m_r.html.
http://books.google.com/books?is=RbLE77b6eRUC&pg=PA471&dq=Magnetic+resistance.
Miyazaki.

* cited by examiner

*Primary Examiner*—Son Dinh
*Assistant Examiner*—Harry W Byrne
(74) *Attorney, Agent, or Firm*—Porzio, Bromberg & Newman, P.C.

(57) ABSTRACT

A magnetic storage device with a significant reduction in power consumption. The magnetic storage device includes: a yoke which is arranged to cover part of a line extending in an arbitrary direction; and a magneto-resistive element which is arranged in contact with the yoke, thereby forming a closed magnetic circuit. The magneto-resistive element is capable of writing information with a field emanating from the yoke. The magnetic storage device satisfies $Iw \leq a \cdot R$, where R is the magnetoresistance of the yoke, Iw is the write current necessary for the line, and a (mA·H)=6E−11.

7 Claims, 19 Drawing Sheets

$\mu 0 = 1.26E-06$
$\mu s = 1000$

| No. | Yoke width BY_1x [W+700nm] nm | Yoke length BY_y nm | Yoke height nm | TopYoke thickness TY_z nm | BottomYoke thickness BY_z nm | Magnetic length (nm) L1 top | L3 bottom | L2 side | $\mu$ ($\mu 0 \mu s$) | Magnetoresistance R1 | R3 | R2 | R 1/H | Write current (mA) A1~A6 | B1~B6 |
|---|---|---|---|---|---|---|---|---|---|---|---|---|---|---|---|
| A1 | 2000 | 500 | 300 | 100 | 20 | 950 | 1900 | 360 | 0.001256 | 1.51E+10 | 1.51E+11 | 5.73E+09 | 1.72E+11 | 6 | |
| A2 | 1500 | 500 | 300 | 100 | 20 | 700 | 1400 | 360 | 0.001256 | 1.11E+10 | 1.11E+11 | 5.73E+09 | 1.28E+11 | 5 | |
| A3 | 1500 | 500 | 300 | 100 | 20 | 700 | 1400 | 360 | 0.001256 | 1.11E+10 | 1.11E+11 | 5.73E+09 | 1.28E+11 | 4 | |
| A4 | 2000 | 900 | 300 | 100 | 20 | 950 | 1900 | 360 | 0.001256 | 8.40E+09 | 8.40E+10 | 3.18E+09 | 9.56E+10 | 2 | |
| A5 | 2000 | 900 | 300 | 100 | 20 | 950 | 1900 | 360 | 0.001256 | 8.40E+09 | 8.40E+10 | 3.18E+09 | 9.56E+10 | 4 | |
| A6 | 1500 | 900 | 300 | 100 | 20 | 700 | 1400 | 360 | 0.001256 | 6.19E+09 | 6.19E+10 | 3.18E+09 | 7.13E+10 | 2 | |
| B1 | 900 | 450 | 230 | 100 | 20 | 400 | 800 | 220 | 0.001256 | 7.08E+09 | 7.08E+10 | 3.89E+09 | 8.17E+10 | | 1.1 |
| B2 | 1800 | 1150 | 180 | 50 | 20 | 875 | 1750 | 220 | 0.001256 | 1.21E+10 | 6.06E+10 | 3.05E+09 | 7.57E+10 | | 1 |
| B3 | 900 | 450 | 230 | 100 | 20 | 400 | 800 | 220 | 0.001256 | 7.08E+09 | 7.08E+10 | 3.89E+09 | 8.17E+10 | | 0.9 |
| B4 | 900 | 450 | 230 | 100 | 20 | 400 | 800 | 220 | 0.001256 | 7.08E+09 | 7.08E+10 | 3.89E+09 | 8.17E+10 | | 0.8 |
| B5 | 900 | 900 | 230 | 100 | 20 | 400 | 800 | 220 | 0.001256 | 3.54E+09 | 3.54E+10 | 1.95E+09 | 4.09E+10 | | 0.5 |
| B6 | 900 | 900 | 180 | 50 | 20 | 425 | 850 | 220 | 0.001256 | 7.52E+09 | 3.76E+10 | 3.89E+09 | 4.90E+10 | | 0.6 |

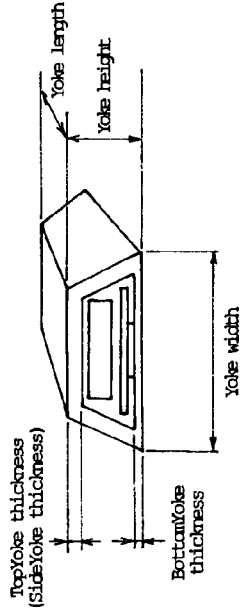

Type A, B

| No. | Yoke width BY_1x IW+700nm nm | Yoke length BY_y nm | Yoke height nm | TopYoke thickness TY_z nm | BottomYoke thickness BY_z nm | Magnetic length (nm) L1 top | L2 side | L3 bottom | Magnetoresistance μ (μ0μs) | R1 | R2 | R3 | R 1/H | Write current (mA) C1~C3 |
|---|---|---|---|---|---|---|---|---|---|---|---|---|---|---|
| C1 | 3000 | 350 | 600 | 100 | 20 | 2900 | 1080 | 2900 | 0.001256 | 65969062784 | 24.567788899 | 3.298E+11 | 4.204E+11 | 28 |
| C2 | 2000 | 350 | 600 | 100 | 20 | 1900 | 1080 | 1900 | 0.001256 | 43221101000 | 24.567788899 | 2.161E+11 | 2.839E+11 | 19 |
| C3 | 2000 | 500 | 600 | 100 | 20 | 1900 | 1080 | 1900 | 0.001256 | 30254777070 | 17197452229 | 1.513E+11 | 1.987E+11 | 12 |

Type C

MAGNETIC STORAGE DEVICE

BACKGROUND OF THE INVENTION

1. Field of the Invention

The present invention relates to a magnetic storage device which stores information in its magneto-resistive elements.

2. Description of the Related Art

MRAM (Magnetic Random Access Memory) has received attention recently as a storage device for use in information processors such as computers and communication apparatuses. MRAM stores data by means of magnetism. Since the direction of magnetization can be maintained without the use of any electrical means, it is possible to avoid any loss of information upon power-down as happens with DRAM (Dynamic Random Access Memory) and SRAM (Static RAM), or other volatile memories. When compared with conventional nonvolatile storing means such as flash EEPROM and hard disk units, MRAM is superior in terms of access speed, reliability, power consumption, and the like. It can thus be said that MRAM is capable of replacing all the functions of volatile memories such as DRAM and SRAM and the functions of nonvolatile storing means such as flash EEPROM and hard disk units (see Japanese Patent Publication No. 3466470).

Consider, for example, the case of developing information equipment that is intended for so-called ubiquitous computing in which information processing is available regardless of location. A requirement of such ubiquitous computing includes a storage device that is capable of high speed processing with reduced power consumption and that can also avoid loss of information, even upon power-down. MRAM has the potential to meet both of these requirements, and is thus expected to be adopted by many information apparatuses in the future.

In particular, for tablets, portable information terminals, and the like that are intended to be carried about daily, it is often difficult to secure sufficient power supply. Thus, in order to perform a large amount of information processing in high use environments, even MRAM of low power consumption requires a further reduction in power consumption during information processing.

Among examples of technologies intended to advance the power savings of MRAM are magnetic storage devices described in Japanese Patent Application Laid-Open Nos. 2000-90658 and 2004-128430. These magnetic storage devices includes, in each of their storage areas (memory cells), a bit line, a word line arranged orthogonal to the bit line, a tunneling magneto-resistive (TMR) element arranged at the intersection between the bit line and the word line, and the like. These magnetic storage devices further include yokes (field control layer) which are arranged near the respective TMR elements so as to surround the bit lines or word lines. The yoke is made of a ferromagnetic substance having high permeability, and functions to reduce the occurrence of flux leakage from the bit line or word line, thereby concentrating the flux into the TMR element. This makes it possible to produce a field necessary for inverting the magnetization of the TMR element, even at low power consumption.

It should be appreciated that a TMR element includes: a first magnetic layer (magnetic sensing layer), which changes its direction of magnetization depending on an external field; a second magnetic layer which has a fixed direction of magnetization; and a nonmagnetic insulating layer which is interposed between the first magnetic layer and the second magnetic layer. This TMR element stores binary data by controlling the direction of magnetization of the first magnetic layer so that the direction of magnetization is parallel or antiparallel to the direction of magnetization of the second magnetic layer.

If the TMR elements used in those magnetic storage devices are reduced in size, then the effects of the diamagnetic fields occurring inside will increase accordingly, requiring stronger write fields. This results in a contradiction because the write currents must be increased if greater integration of the magnetic storage devices is intended. It is therefore generally noted that magnetic storage devices are difficult to miniaturize and difficult to enhance the recording density thereof.

SUMMARY OF THE INVENTION

The present invention has been developed in view of the foregoing problem. It is thus an object of the present invention to prove that a magnetic storage device can significantly be miniaturized, and to concurrently achieve a reduction in power consumption.

The inventors have undertaken intensive studies, and both theoretically and experimentally found that a scaling rule holds true for magnetic storage devices. Through the use of this scaling rule, the foregoing object has been achieved by the following means.

A first aspect of the present invention is a magnetic storage device including: a line; a yoke made of a magnetic layer, circumferentially covering part of the line; and a magneto-resistive element arranged in contact with the yoke so as to close a circuit of a magnetic field emanating from the yoke, the magneto-resistive element being capable of writing information using the field. The device satisfies the equation of $Iw \leq a \cdot R$, where R (being 1/H) is a magnetoresistance of the yoke, Iw(mA) is a write current necessary for the line, and a $(mA \cdot H) = 6E-11$.

The magnetic storage device according to the first aspect of the present invention, further satisfying the equation of $Iw \leq a \cdot R$, where R (being 1/H) is the magnetoresistance of the yoke, Iw(mA) is the write current necessary for the line, and a $(mA \cdot H) = 4E-11$.

The magnetic storage device according to the first aspect of the present invention, wherein the yoke has an annular shape.

The magnetic storage device according to the first aspect of the present invention, wherein the yoke has a gap, and the magneto-resistive element is arranged to bridge the gap.

According to the present invention, it is possible to significantly reduce the write current and to provide the excellent effect of reducing variations in the values of the write currents of respective magnetic storage devices at the time of as mass production.

BRIEF DESCRIPTION OF THE DRAWINGS

The above and other objects, features and advantages of the present invention will become apparent from the following description and appended claims, taken in conjunction with the accompanying drawings.

FIG. 16 is a chart showing the result of an analysis on magnetic storage devices according to practical examples;

DETAILED DESCRIPTION OF THE PREFERRED EMBODIMENTS

Figure 1:
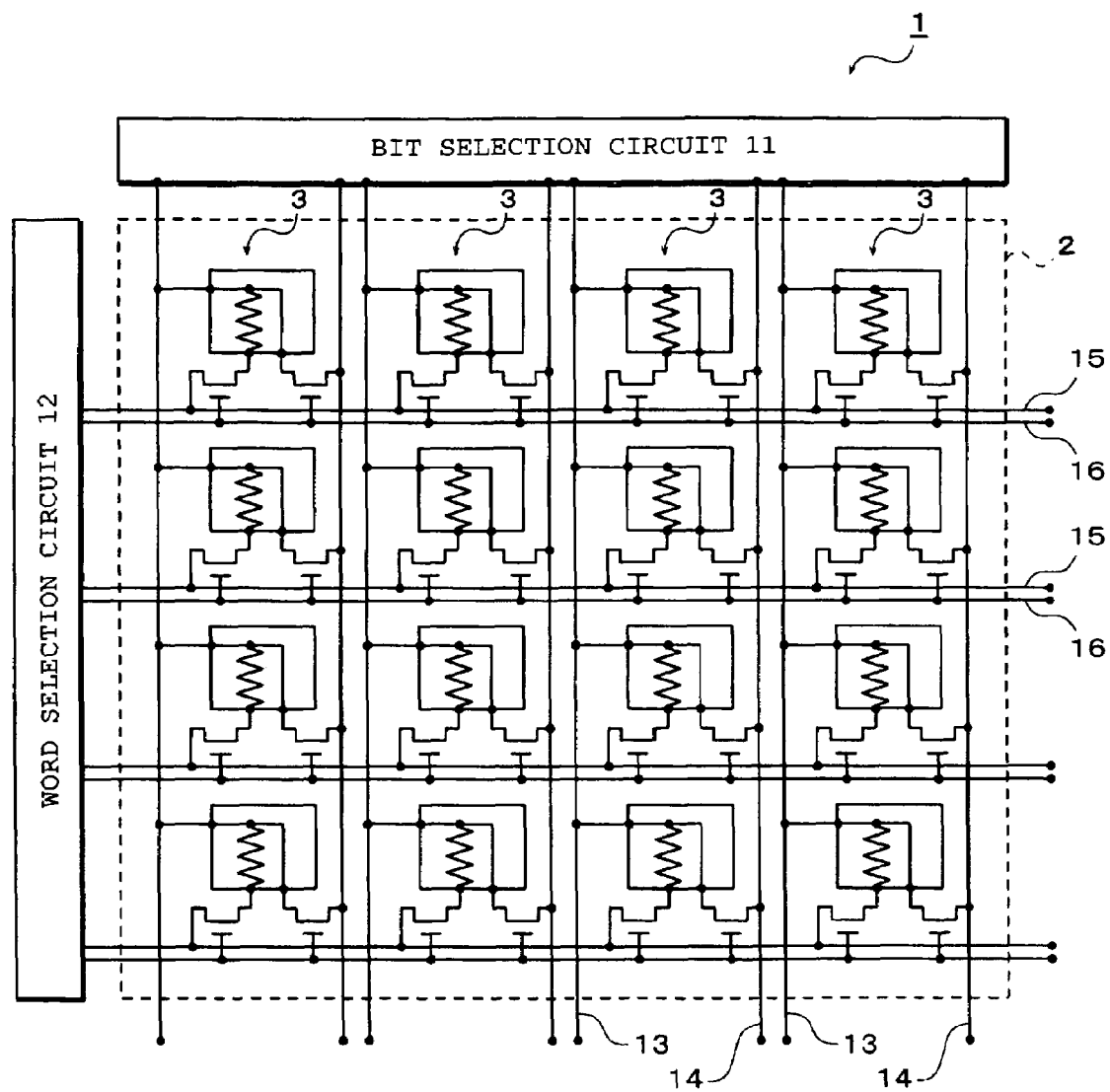
FIG. 1 is a conceptual diagram showing the overall configuration of a magnetic storage device 1 according to a first embodiment of the present invention.

Hereinafter, embodiments of the present invention will be described in detail. It should be noted that the same elements in the drawings will be designated by like reference numerals, and a redundant description will be omitted.

Figure 2:
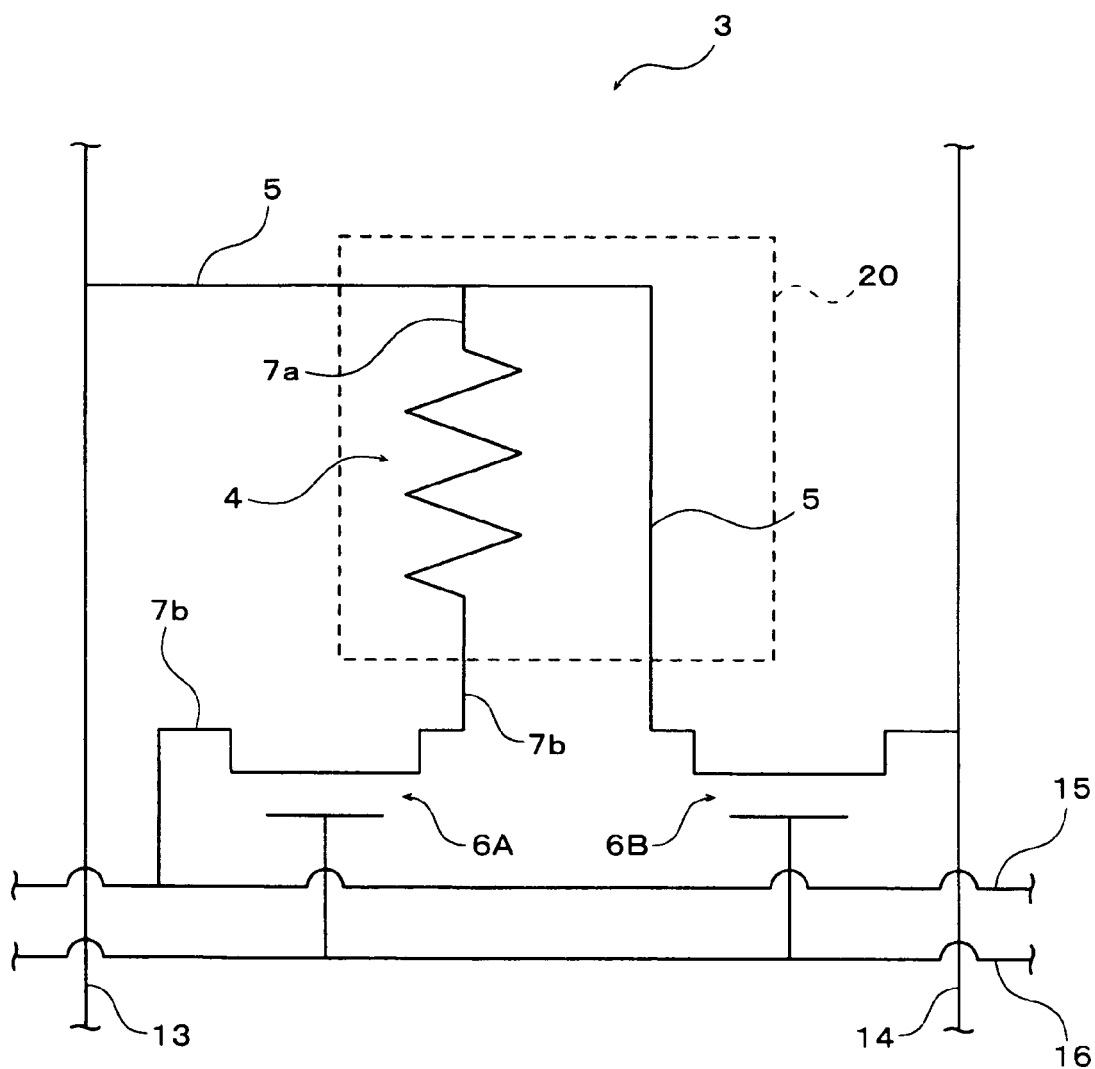
FIG. 2 is a conceptual diagram showing an enlarged storage area of the magnetic storage device.

FIG. 1 is a conceptual diagram showing the overall configuration of a magnetic storage device 1 according to a first embodiment of the present invention. The magnetic storage device 1 includes a storage unit 2, a bit selection circuit 11, a word selection circuit 12, bit lines 13 and 14, and word lines 15 and 16. The storage unit 2 has a plurality of storage areas 3 which are arranged in a two-dimensional configuration (array) with m rows and n columns (m and n are integers not smaller than 2). As shown enlarged in FIG. 2, each storage area 3 has a TMR element 4, a write line 5, a read transistor 6A, a write transistor 6B, read lines 7a and 7b, a ferromagnetic yoke 20, and so on. It should be appreciated that the write line 5 is laid so that it is led in from the bit line 13. The storage areas 3 are thus individually provided with write lines 5, ferromagnetic yokes 20, and the like. In the present embodiment, the read lines 7a and 7b are arranged so as to be branched out from the write line 5. The TMR element 4 is interposed between one read line 7a and the other read line 7b.

The TMR (magneto-resistive) element 4 has the function of being able to change its own resistance based on a change in the direction of magnetization. The state of change of this resistance is utilized in order to write binary data to the TMR element 4. The direction of magnetization of this TMR element 4 is changed by an external field which is generated by the write line 5.

The write line 5, laid so as to be led in from the bit line 13, is electrically connected to the bit line 14 at the other end. The write transistor 6B is switching means for controlling the conduction of a write current through the write line 5. Its source and drain are interposed in the middle of the write line 5. The gate is connected to the word line 16. The write transistor 6B can thus be brought into a conducting state by controlling, such as by increasing, the potential of the word line 16.

One of the ends of the read line 7a is connected to the TMR element 4, and the other end is connected to the write line 5 (or to the bit line 13). One of the ends of the read line 7b is connected to the ferromagnetic yoke 20 which is in contact with the TMR element 4. The other end is connected to the word line 15. The read transistor 6A is switching means for controlling the conduction of a read current through the read lines 7a and 7b. Its drain and source are interposed in the middle of the read line 7b. The gate is connected to the word line 15. The read transistor 6A can thus be brought into a conducting state by controlling, such as by increasing, the potential of the word line 15.

The bit lines 13 and 14 are provided for each column of the plurality of storage areas 3, which are arranged in an array. The bit line 13 is connected to the write lines 5 of all the storage areas 3 that pertain to the corresponding column. Similarly, the bit line 14 is also connected to the write lines 5 of all the storage areas 3 that pertain to the corresponding column. That is, if a potential difference is applied between a certain pair of bit lines 13 and 14, and a write transistor 6B permits conduction, then a write current will flow through the corresponding write line 5.

The word lines 15 and 16 are provided for each row of storage areas 3. The word line 16 is connected to the gates of the read transistors 6A and the write transistors 6B in all the storage areas 3 that pertain to the corresponding row. That is, the word line 16 functions as a line for permitting conduction of both the transistors 6A and 6B. The word line 15 is connected to the read lines 7b in all the storage areas 3 that pertain to the corresponding row. Consequently, if a potential difference is applied between a certain pair of a bit line 13 and a word line 15, and the write transistors 6A permit conduction, then a read current will flow through the corresponding read lines 7a and 7b.

Returning to FIG. 1, the bit selection circuit 11 has the function of providing a positive or negative write current to the write lines 5 of the respective storage areas 3. Specifically, the bit selection circuit 11 includes an address decoder circuit and a current drive circuit. The address decoder circuit selects a predetermined column from the array of storage areas 3 in accordance with an address specified either internally or externally. The current drive circuit applies a positive or negative potential difference between a pair of bit lines 13 and 14 corresponding to the predetermined column selected, and supplies write currents to the write lines 5 that are arranged between the bit lines 13 and 14 in the predetermined column.

The word selection circuit 12 includes an address decoder circuit and a current drive circuit. The address decoder circuit selects a predetermined row from the array of storage areas 3 in accordance with an address specified either internally or externally. The current drive circuit supplies predetermined voltages to the word lines 15 and 16 corresponding to the predetermined row. Thus, the word selection circuit 12 can be used to apply a control voltage to the word line 16 that corresponds to the predetermined row, so that the read transistors 6A and the write transistors 6B enter into a conducting state.

In a write operation, a positive or negative potential difference is applied between bit lines 13 and 14 that correspond to the address selected by the bit selection circuit 11. The write transistors 6B at the address selected by the word selection circuit 12 are also turned ON. As a result, a write current can be passed through the specific storage area 3 at the intersection of the bit-side address and the word-side address. Note that the potential difference between the bit line 13 and the word line 15 is set to zero during a write operation so that no current flows through the read line 7.

In a read operation, the bit selection circuit 11 selects, with its address decoder circuit, a row corresponding to the address specified either internally or externally, and applies a predetermined voltage to that bit line 13. At the same time, the word selection circuit 12 selects, with its address decoder circuit, a row corresponding to a specified address, and applies a predetermined voltage to the word line 15 corresponding to that row, thereby supplying a read current between the bit line 13 and the word line 15. A potential difference is also created across the word line 16, thereby turning the read transistors 6A ON. As a result, a read current can be passed through the specific storage area 3 at the intersection of the bit-side address and the word-side address. Note that the potential difference between the bit lines 13 and 14 is set to zero during a read operation so that no write current flows.

Figure 3:
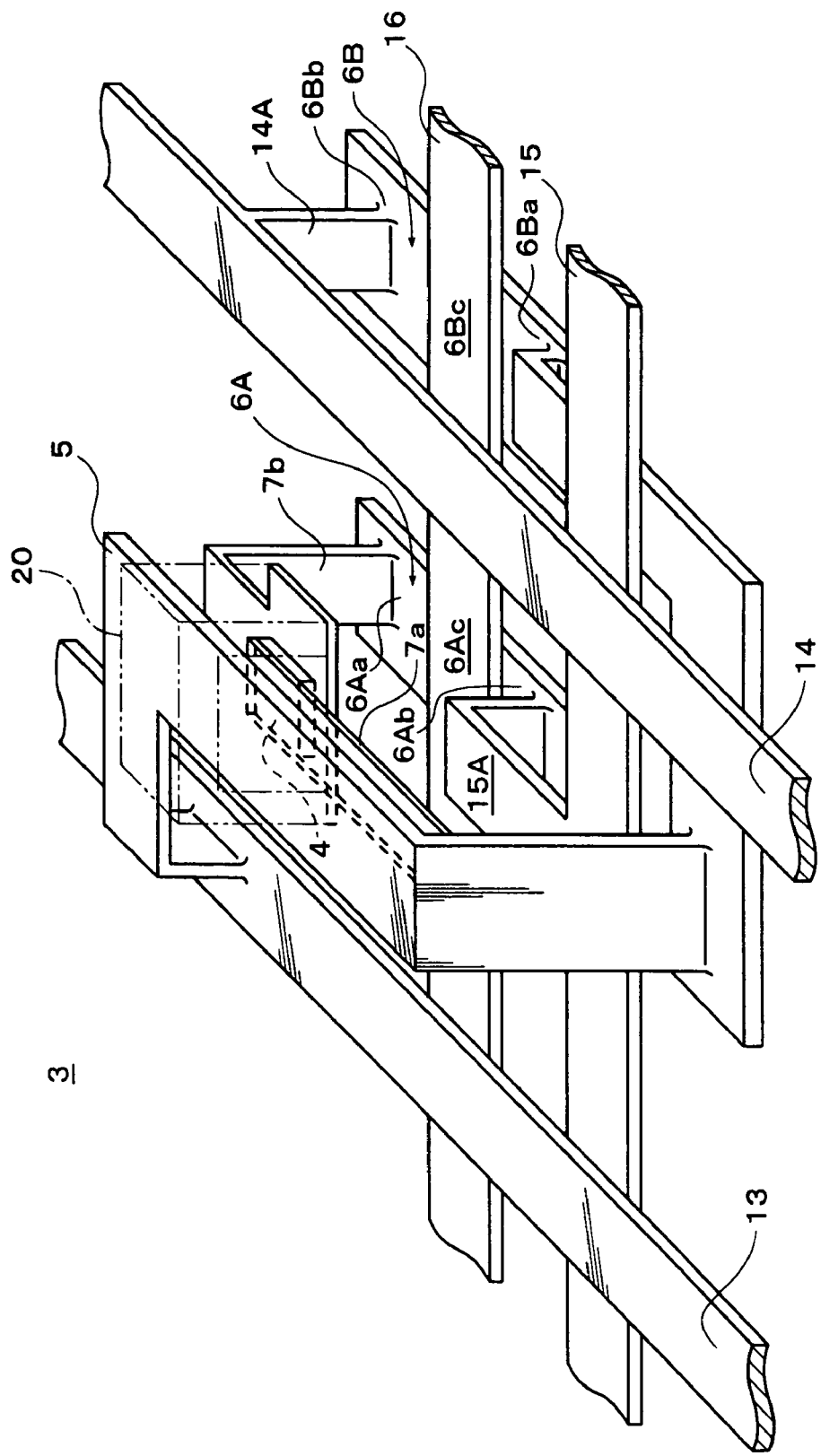
FIG. 3 is an enlarged perspective view showing the internal structure of the storage area in a three-dimensional fashion.

The specific structure of the storage areas 3 in the magnetic storage device 1 will now be described in detail. FIG. 3 is a perspective view showing the wiring state of a storage area 3 in a three-dimensional fashion. The storage area 3 includes, roughly from the bottom upward, a semiconductor layer, a wiring layer, and a magnetic material layer. The semiconductor layer includes a semiconductor substrate, which is not shown in particular. The semiconductor layer is provided with semiconductor devices such as the read transistor 6A and the write transistor 6B while maintaining the mechanical strength of the entire storage area 3. The topmost magnetic material layer is primarily provided with components that are made of magnetic materials, such as the TMR element 4 and the ferromagnetic yoke 20 for applying a magnetic field to the TMR element 4 effectively. The intermediate wiring layer is provided with the bit lines 13 and 14, the word lines 15 and 16, part of the write line 5, the read line 7b, and so on.

The read transistor 6A and the write transistor 6B on the semiconductor layer are formed so that they are each surrounded by an insulating area. The insulating area is made of an insulating material such as $SiO_2$. An example of the semiconductor substrates of the transistors is an Si substrates, doped with either p-type or n-type impurities.

Figure 4:
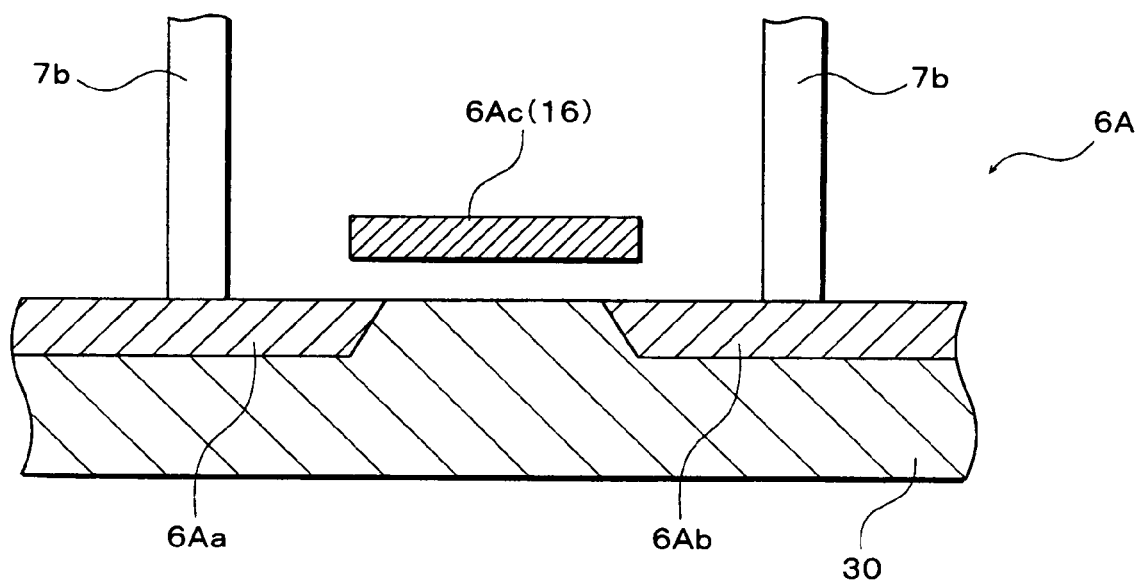
FIG. 4 is an enlarged sectional view showing the structure of a transistor in the storage area.

As shown enlarged in FIG. 4, the read transistor 6A includes a drain region 6Aa, a source region 6Ab, and a gate electrode 6Ac, which are of a conduction type opposite to that of a semiconductor substrate 30. That is, the semiconductor substrate 30 is interposed between the drain region 6Aa and the source region 6Ab, and the gate electrode 6Ac is arranged on the semiconductor substrate 30 at a predetermined distance away from the semiconductor substrate 30. This gate electrode 6Ac is connected to the word line 16. Because of this configuration, when a voltage is applied to the word line 16, the drain region 6Aa and the source region 6Ab of the read transistor 6A come into conduction with each other so that the read current supplied from the bit line 13 flows through the read line 7a, the TMR element 4, and the read line 7b. It should be appreciated that the write transistor 6B generally has the same configuration. A description thereof will thus be omitted in this instance.

Returning to FIG. 3, the entire area of the wiring layer excluding such lines as the bit lines 13 and 14, the word lines 15 and 16, and the read line 7b is occupied by an insulating area. Like the insulating area of the semiconductor layer, this insulating area is also made of an insulating material such as $SiO_2$. The lines may be made of W or Al, for example.

The write line 5, which adjoins the TMR element 4, extends along the array plane of the storage area 3 and is bent in an L shape within this plane. Both ends of this write line 5 are bent into perpendicular lines in a direction perpendicular to the plane. The lower end of one of the perpendicular lines is connected to the bit line 13. The lower end of the other perpendicular line makes an ohmic junction with the drain region 6Ba of the write transistor 6B through a horizontal line. The bit line 14 is perpendicularly branched out to make a lead 14A corresponding to each individual storage area 3. The lower end thereof makes an ohmic junction with the source region 6Bb of the write transistor 6B. As a result, the write line 5 is laid to bridge the pair of bit lines 13 and 14 with the write transistor 6B interposed therebetween.

The read line 7a extends in the direction of the plane. One of its ends is electrically connected to the TMR element 4, and the other end is connected to the write line 5. One of the ends of the read line 7b is electrically connected to the ferromagnetic yoke 20, and the other end is perpendicularly bent into a perpendicular line. The lower end of this perpendicular line makes an ohmic junction with the source region 6Ab of the read transistor 6A. The word line 15 is perpendicularly branched out to make a lead 15A corresponding to each individual storage area 3. The lower end thereof makes an ohmic junction with the drain region 6Aa of the read transistor 6A. As a result, the bit line 13 and the word line 16 are electrically connected to each other through part of the write line 5, the read line 7a, the TMR element 4, the ferromagnetic yoke 20, the read line 7b, and the read transistor 6A, which are arranged in this order.

It should be appreciated that the word line 16 extending in the row direction is electrically connected to the gate electrodes 6Ac and 6Bc.

Figure 5:
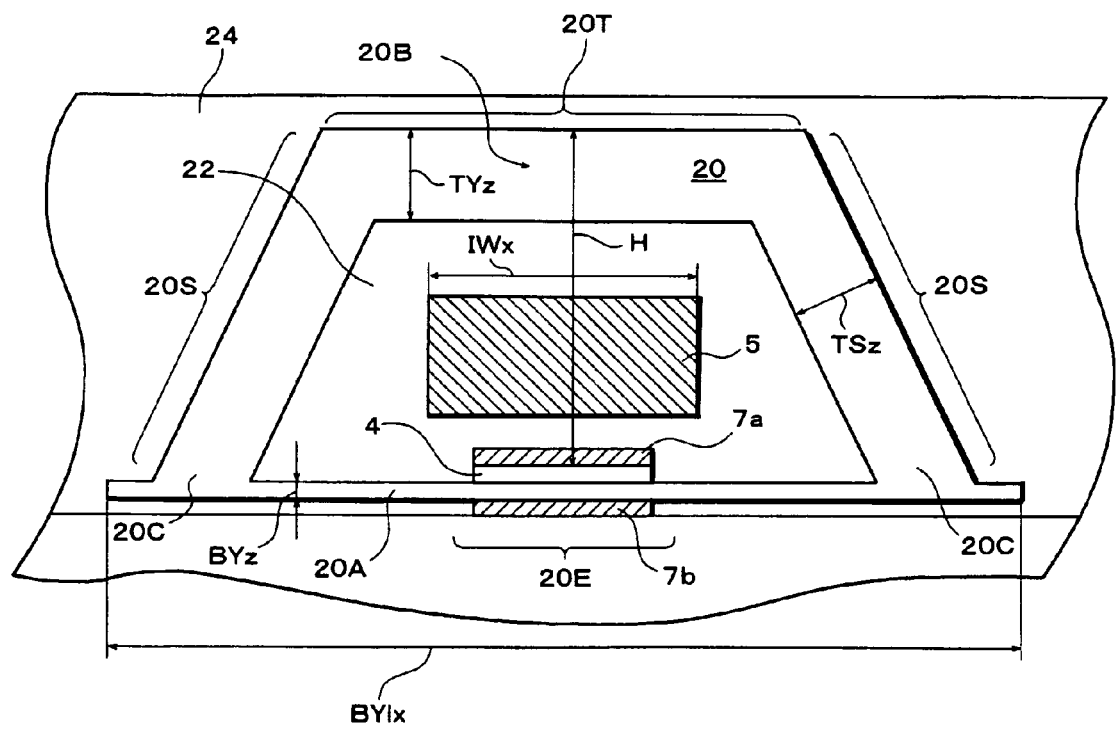
FIG. 5 is an enlarged sectional view showing the structure of a ferromagnetic yoke in the storage area.

The magnetic material layer will now be described with reference to FIG. 5 and so on. The magnetic material layer includes the TMR element 4, the ferromagnetic yoke 20, part of the write line 5, the read line 7a, and the like. It should be appreciated that the entire area of the magnetic material layer, excluding the components and the other lines to be described below, is occupied by an insulating area 24.

Figure 6:
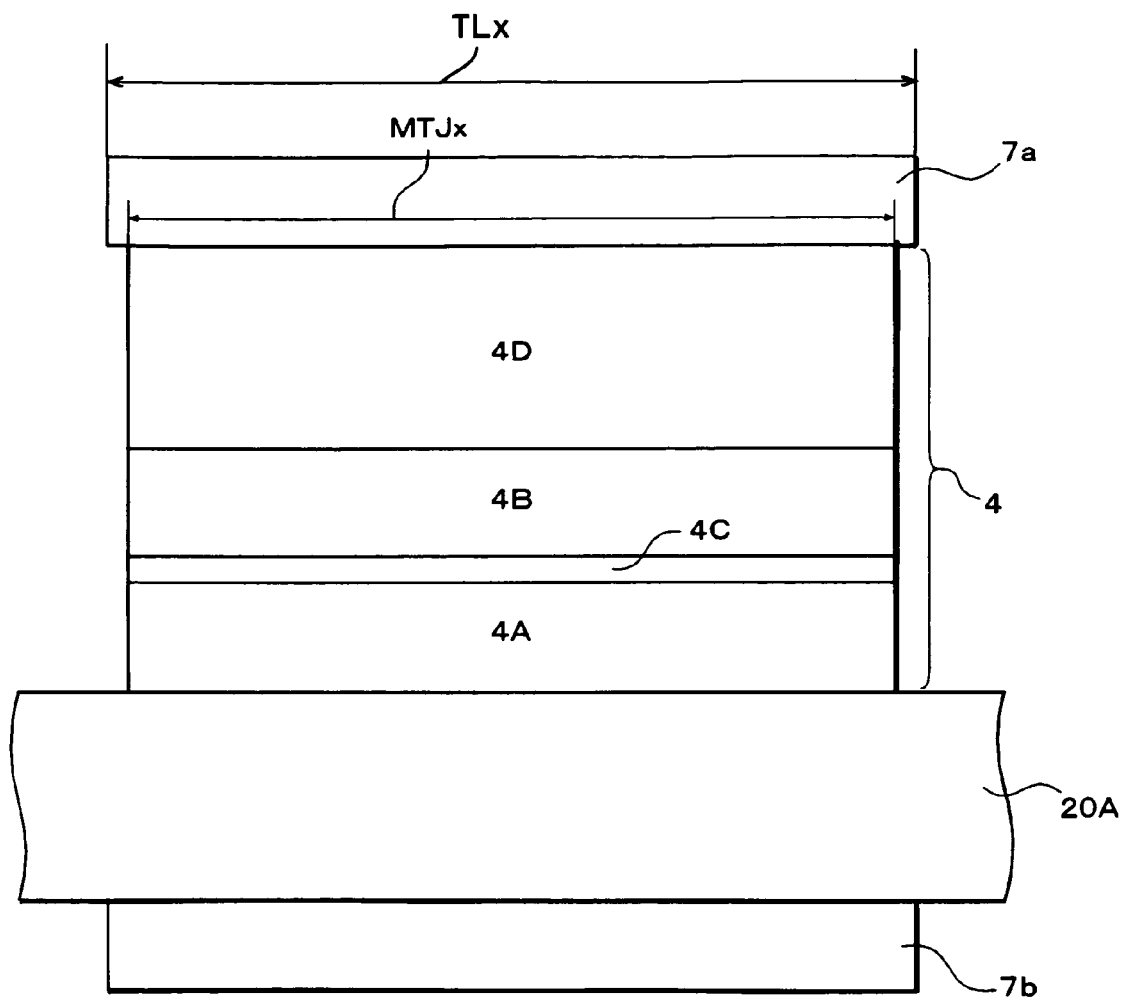
FIG. 6 is an enlarged sectional view showing the layer structure of a TMR element to be arranged in the storage area.

As shown enlarged in FIG. 6, the TMR element 4 includes a first magnetic layer (free layer/magnetic sensing layer) 4A, a second magnetic layer (pinned layer) 4B, a nonmagnetic insulating layer (insulator layer) 4C, and an antiferromagnetic layer 4D. The first magnetic layer 4A changes its direction of magnetization depending on an external field. The second magnetic layer 4B has a fixed direction of magnetization. The nonmagnetic insulating layer 4C is sandwiched between the first magnetic layer 4A and the second magnetic layer 4B. The antiferromagnetic layer 4D fixes (pins) the direction of magnetization of the second magnetic layer. In this TMR element 4, when the first magnetic layer 4A is exposed to an external field and changes its direction of magnetization, the resistance between the first magnetic layer 4A and the second magnetic layer 4B varies in value. This difference in resistance can be utilized to record binary data.

The first magnetic layer 4A may be made of ferromagnetic materials such as Co, CoFe, NiFe, NiFeCo, and CoPt and the like.

The direction of magnetization of the second magnetic layer 4B is fixed by the antiferromagnetic layer 4D. That is, exchange coupling at the joint between the antiferromagnetic layer 4D and the second magnetic layer 4B stabilizes the direction of magnetization of the second magnetic layer 4B as oriented in one direction. The easy axis of magnetization of the second magnetic layer 4B is oriented along that of the first magnetic layer 4A. The second magnetic layer 4B may be made of ferromagnetic materials such as Co, CoFe, NiFe, NiFeCo, and CoPt and the like. The antiferromagnetic layer 4D may be made of materials such as IrMn, PtMn, FeMn, PtPdMn, and NiO, or any combination thereof.

The nonmagnetic insulating layer 4C is made of a nonmagnetic insulating material. It is interposed between the first magnetic layer 4A and the second magnetic layer 4B so as to produce a tunneling magneto-resistive effect (TMR). To be more specific, the nonmagnetic insulating layer 4C characteristically changes its electrical resistance depending on the relationship between the directions of magnetization of the first magnetic layer 4A and the second magnetic layer 4B (i.e., parallel or antiparallel). The nonmagnetic insulating layer 4C is preferably made of oxides or nitrides of such metals as Al, Zn, and Mg.

The first magnetic layer 4A is in contact with the ferromagnetic yoke 20 in order to provide electrical connection. The ferromagnetic yoke 20 is electrically connected to the read line 7b. The antiferromagnetic layer 4D is electrically connected to the read line 7a. This configuration makes it possible to pass a read current from the read line 7a to the read line 7b through the TMR element 4 and the ferromagnetic yoke 20, thereby making a change in the resistance of the TMR element 4 detectable. It should be appreciated that the ferromagnetic yoke 20 is arranged so as to cover the area where the write line 5 adjoins the TMR element 4. In the TMR element 4, the easy axis of magnetization of the first magnetic layer 4A is oriented across the longitudinal direction of the write line 5 (i.e., across the direction of the write current).

Although not shown in particular, the TMR element 4 may include a first magnetic layer (free layer/magnetic sensing layer), a nonmagnetic insulating layer (insulator layer), a second magnetic layer, a nonmagnetic metal layer, a third magnetic layer, and an antiferromagnetic layer in this order. The antiferromagnetic layer fixes (pins) the direction of magnetization of the third magnetic layer. Then, the nonmagnetic metal layer can be adjusted in thickness so that the direction of magnetization of the second magnetic layer becomes antiparallel to the direction of magnetization of the third magnetic layer. This configuration utilizes an exchange interaction that occurs between the second magnetic layer and the third magnetic layer.

Returning to FIG. 5, the ferromagnetic yoke 20 includes an element side yoke 20A and a counter element side yoke 20B. The element side yoke 20A is arranged on the side of the extending write line 5 that faces toward the TMR element 4, and is in contact with this TMR element 4. The counter element side yoke 20B is arranged close to the side of the write line 5 which is on the opposing side to the TMR element 4. A pair of yoke connecting portions 20C are arranged on both sides of the element side yoke 20A and on both sides of the counter element side yoke 20B so as to connect them into an annular shape. When viewed from the TMR element 4, the element side yoke 20A is in contact with the TMR element 4 and the counter element side yoke 20B is away from the TMR element 4. Moreover, this ferromagnetic yoke 20 itself can be said to cover part of the outer periphery of the write line 5. The counter element side yoke 20B is composed of a top area 20T, which lies over the write line 5, and sloping areas 20S, which lie on both sides of this top area 20T, i.e., near the yoke connecting portions 20C. It should be appreciated that the ferromagnetic yoke 20 also has the function of protecting the TMR element 4 from adversely-affecting external fields.

The TMR element 4 is generally located at the center of the top of the element side yoke 20A. In an axial view, the ferromagnetic yoke 20 has a trapezoidal annular structure. This ferromagnetic yoke 20 therefore forms a closed magnetic circuit.

The sloping areas 20S and the yoke connecting portions 20C guide a magnetic field occurring in the top area 20T toward the element side yoke 20A (i.e., toward the TMR element 4). The internal field occurring in the top area 20T is thus inverted through the sloping areas 20S and the yoke connecting portions 20C to make an internal field of the opposite direction in the element side yoke 20A. The counter element side yoke 20B is also shaped so that the sloping areas 20S tilt toward the element side yoke 20A. More specifically, the angles P between the top area 20T and the sloping areas 20S (see FIG. 7) are set at obtuse angles. Meanwhile, the yoke connecting portions 20C form acute connecting angles between the element side yoke 20A and the sloping areas 20S. The sloping areas 20S are also given a thickness greater than that of the element side yoke 20A.

The top area 20T of the counter element side yoke 20B has a thickness TYz which is greater than the thickness BYz of the element side yoke 20A. For example, the thickness TYz is set greater than or equal to 50 nm. The thickness TYz has no particular upper limit in terms of magnetoresistance. The element side yoke 20A, being thinner than the counter element side yoke 20B, has a thickness BYz of 10 nm or greater. The thickness BYz has no particular upper limit in terms of magnetoresistance. The sloping areas 20S have a thickness TSz which is determined so as to make the counter element side yoke 20B and the element side yoke 20A as continuous as possible in terms of magnetoresistance. The maximum height H of the counter element side yoke 20B from the TMR element 4 is set at less than or equal to 300 nm, for example. The width BYlx of the ferromagnetic yoke 20 depends on the width IWx of the write line 5. Specifically, BYlx is set so as to satisfy the relationship BYlx=IWx+700 nm. Since the write line 5 has a width IWx in the range of 0.2 μm to 0.8 μm, it follows that BYlx=900 nm to 1500 nm. Although not shown in particular, the ferromagnetic yoke 20 has a depth (dimension in the longitudinal direction of the line) BYy in the range of 0.45 μm to 0.8 μm. As shown in FIG. 6, the read line 7 has a width TLx which falls within the range of 500 nm to 1400 nm, for example. The TMR element 4 has a width MTJx which is set in the range of 0.2 μm to 0.8 μm. Although not shown in particular, the TMR element 4 has a depth MTJy in the range of 0.2 μm to 1.6 μm.

It should be appreciated that this ferromagnetic yoke 20 is preferably manufactured by integrally depositing the sloping areas 20S and the top area 20T in a series of processes. This allows a reduction in manufacturing costs. The ferromagnetic yoke 20 is preferably made of ferromagnetic material such as a metal that contains at least one of Ni, Fe, and Co.

A description will now be given of an information write operation on the TMR element 4 according to the magnetic storage device 1 of the first embodiment.

Figure 7:
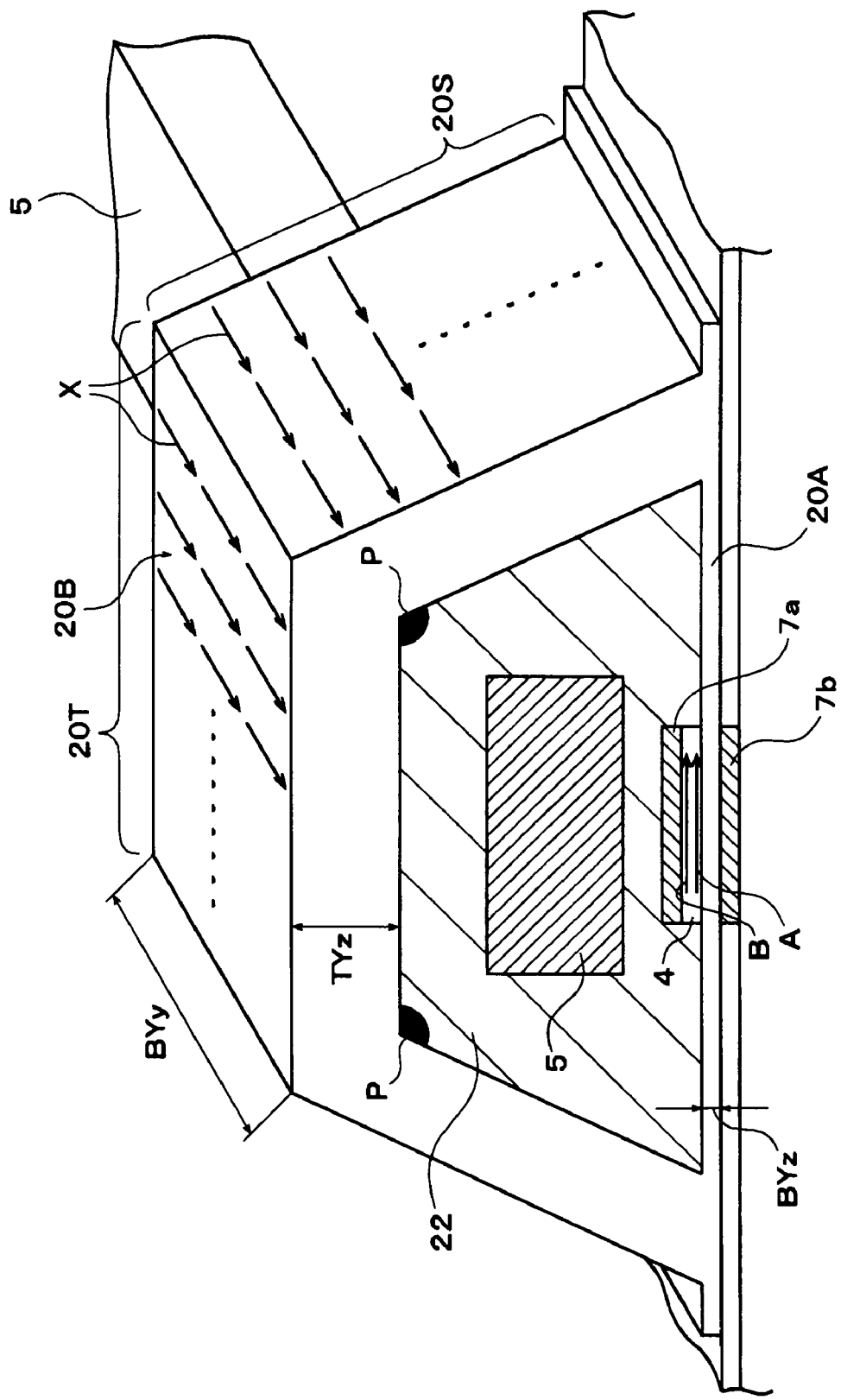
FIG. 7 is a partially sectional perspective view schematically showing a state of magnetization of the ferromagnetic yoke in the storage area.

In FIG. 7, consider the case where no current flows through the write line 5. This write line 5 then produces no magnetic field. The state of magnetization X of the ferromagnetic yoke 20 preferably includes single domains that generally coincide with the extending direction of the write line 5. If the state of magnetization X includes a plurality of domains in different directions, an antiferromagnetic layer is desirably overlaid to forcefully make them into single domains. It should be appreciated that in this instance the direction of magnetization B of the second magnetic layer 4B and the direction of magnetization A of the first magnetic layer 4A coincide with each other in the TMR element 4. According to the present embodiment, the coincidence of the directions of magnetization A and B is defined as binary data of 0 being written.

Figure 8:
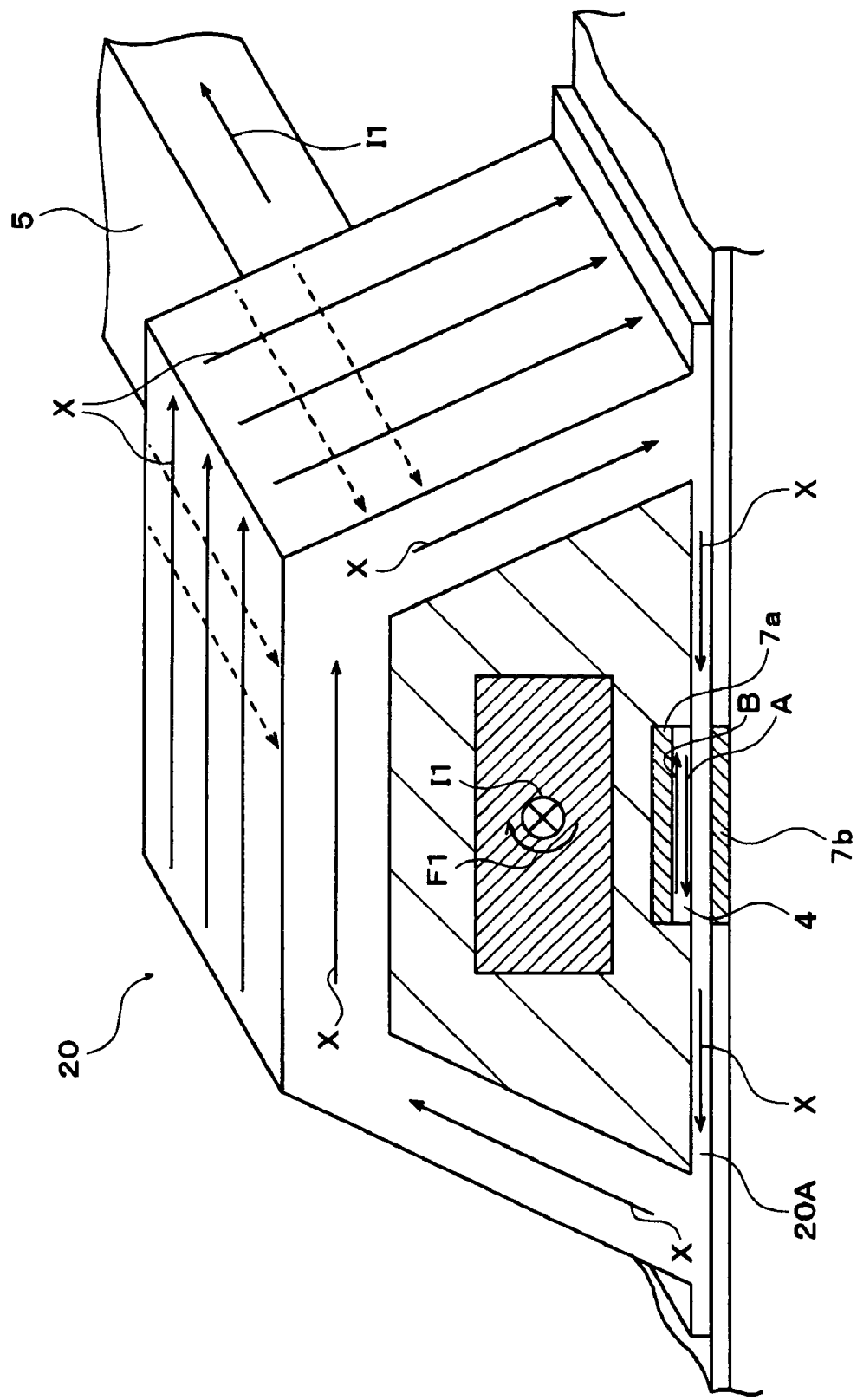
FIG. 8 is a partially sectional perspective view schematically showing the state of magnetization of the ferromagnetic yoke in the storage area.

As shown in FIG. 8, when a write current I1 flows through the write line 5, a circumferential field F1 occurs around the write line 5. The field F1 magnetizes the surrounding ferromagnetic yoke 20 in the direction of the state of magnetization X, thereby magnetizing the element side yoke 20A.

The field F1 emanating from the write line 5 and the field induced by the state of magnetization X emanating from the ferromagnetic yoke 20 are synthesized into a high field, which is concentrated through the element side yoke 20A. As a result, the ferromagnetic coupling between this element side yoke 20A and the first magnetic layer 4A of the TMR element 4 in contact with the same inverts the direction of magnetization A. When the current I1 of the write line 5 is stopped in this state, the direction of magnetization A of the TMR element 4 is maintained as inverted, as shown in FIG. 8. Since the directions of magnetization A and B are maintained opposite to each other, this translates into binary data of 1 being written.

Figure 9:
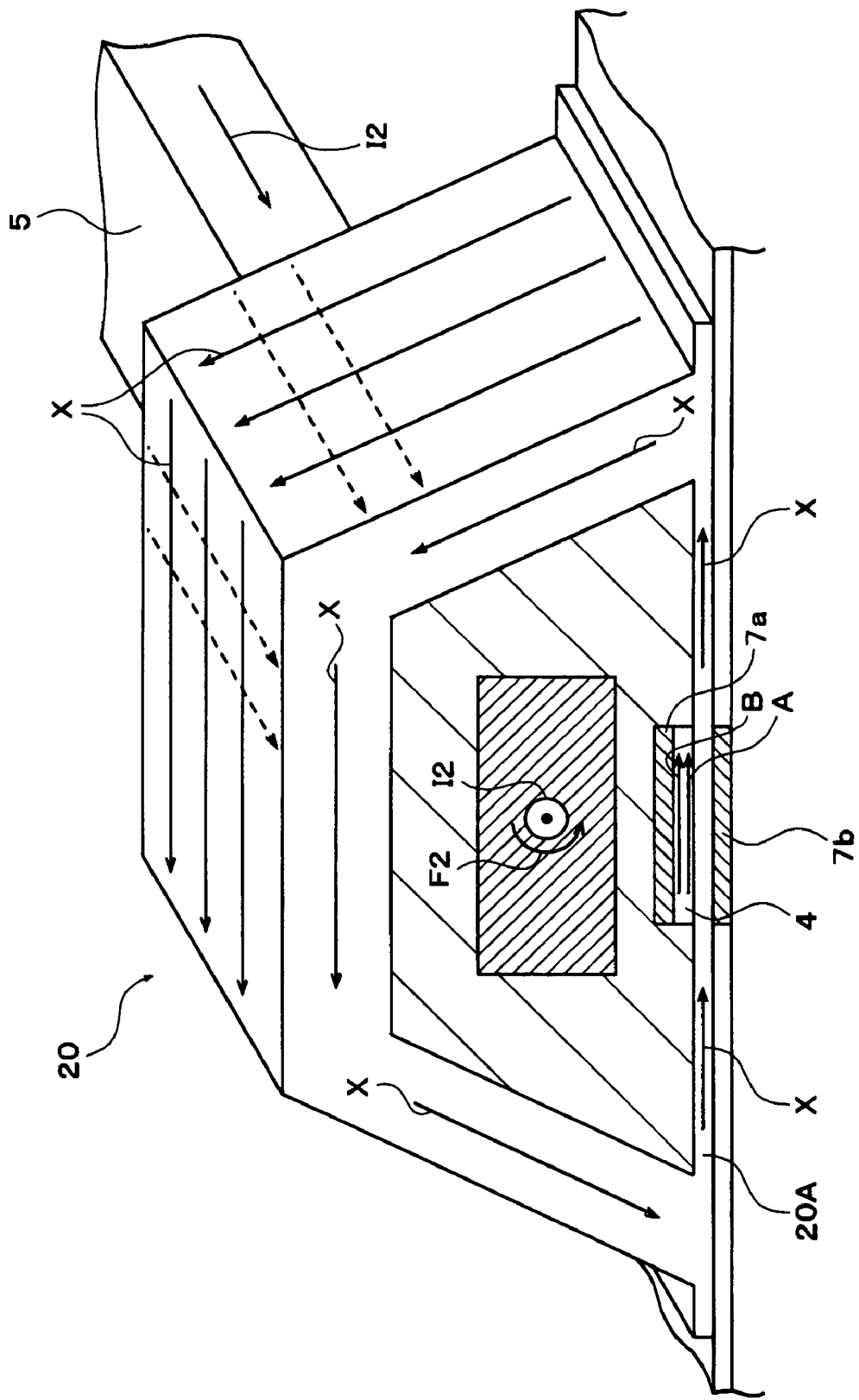
FIG. 9 is a partially sectional perspective view schematically showing the state of magnetization of the ferromagnetic yoke in the storage area.

As shown in FIG. 9, when a write current I2 that is reverse to the write current I1 flows through the write line 5, a circumferential field F2 occurs around the write line 5. The state of magnetization X of the surrounding ferromagnetic yoke 20, being induced by the field F2, turns its direction by 90° into the same direction as that of the field F2.

Consequently, the field F2 emanating from the write line 5 and the field induced by the state of magnetization X emanating from the ferromagnetic yoke 20 are synthesized into a high field. This high field is concentrated through the element side yoke 20A, and acts on the first magnetic layer 4A of the TMR element 4 to invert the direction of magnetization A thereof. The direction of magnetization A of the first magnetic layer 4A coincides with the direction of magnetization B of the second magnetic layer B again. Since the directions of magnetization A and B coincide with each other, it translates into binary data of 0 being written in the TMR element 4 again.

When reading binary data written in the TMR element 4, a read current is passed between the read lines 7a and 7b to detect a change in the potential difference between the lines. This shows the resistance of the TMR element 4, thereby determining which binary data is recorded (i.e., whether the direction of magnetization A of the first magnetic layer 4A is parallel or antiparallel to the direction of magnetization B of the second magnetic layer 4B). For example, if the direction of magnetization A of the first magnetic layer 4A coincides with the direction of magnetization B of the second magnetic layer 4B, the resistance between the first magnetic layer 4A and the second magnetic layer 4B becomes relatively low due to the tunneling magneto-resistive effect (TMR) of the non-magnetic insulating layer 4C. If the direction of magnetization A is opposite to the direction of magnetization B, on the other hand, the resistance between the first magnetic layer 4A and the second magnetic layer 4B becomes relatively high due to the tunneling magneto-resistive effect.

A description will now be given of the value of the write current Iw in the magnetic storage device 1. Assuming that the ferromagnetic yokes 20 in the magnetic storage device 1 have a magnetoresistance of R, the write current Iw of the magnetic storage device 1 satisfies the following equation (1A):

$$Iw \leq a \cdot R \text{ (where } a(mA \cdot H) = 6E - 11). \quad (1A)$$

It is even preferable to satisfy the following equation (1B):

$$Iw \leq a \cdot R \text{ (where } a(mA \cdot H) = 4E - 11). \quad (1B)$$

The magnetoresistance R can be expressed as $R = L/(S\mu)$, where L is the magnetic length of that particular portion, S is the cross-sectional area, and $\mu$ is the magnetic permeability. Assuming that the magnetoresistance of the top area 20T is R1, the magnetoresistances of the respective slop areas 20S are R2, and the magnetoresistance of the element side yoke 20A is R3, then the magnetoresistance R of the ferromagnetic yoke 20 is given by the sum total of $R1 + R2 \times 2 + R3$.

Specifically, suppose that this ferromagnetic yoke 20 has a depth (being length in the wiring direction) BYy of 900 nm, the top area 20T has a thickness TYz of 100 nm, the element side yoke 20A has a thickness BYz of 20 nm, the top area 20T has a magnetic length L1 of 400 nm, the sloping areas 20S have a magnetic length L2 of 220 nm each, and the counter element side yoke 20B has a magnetic length L3 of 800 nm. Then, the magnetoresistance R of the entire ferromagnetic yoke 20 is 8.17E+10 (1/H). (See Sample No. B1 in FIG. 16, being a practical example to be described later.) In this practical example, the write current I turns out to be 1.1 mA, which satisfies both of the foregoing equations (1A) and (1B).

A description will now be given of why this equation (1A) must be satisfied.

The inventors have found that the value R of the magnetoresistance of the ferromagnetic yoke 20 is essential to the magnetic storage device 1 having a yoke structure like that of the present embodiment. Specifically, they have determined a scaling rule such that when the ferromagnetic yoke 20 is arranged around a write line 5 of the magnetic storage device 1 with an appropriate adjustment in shape, the write current Iw decreases with the decreasing size of the ferromagnetic yoke 20.

Figure 10:
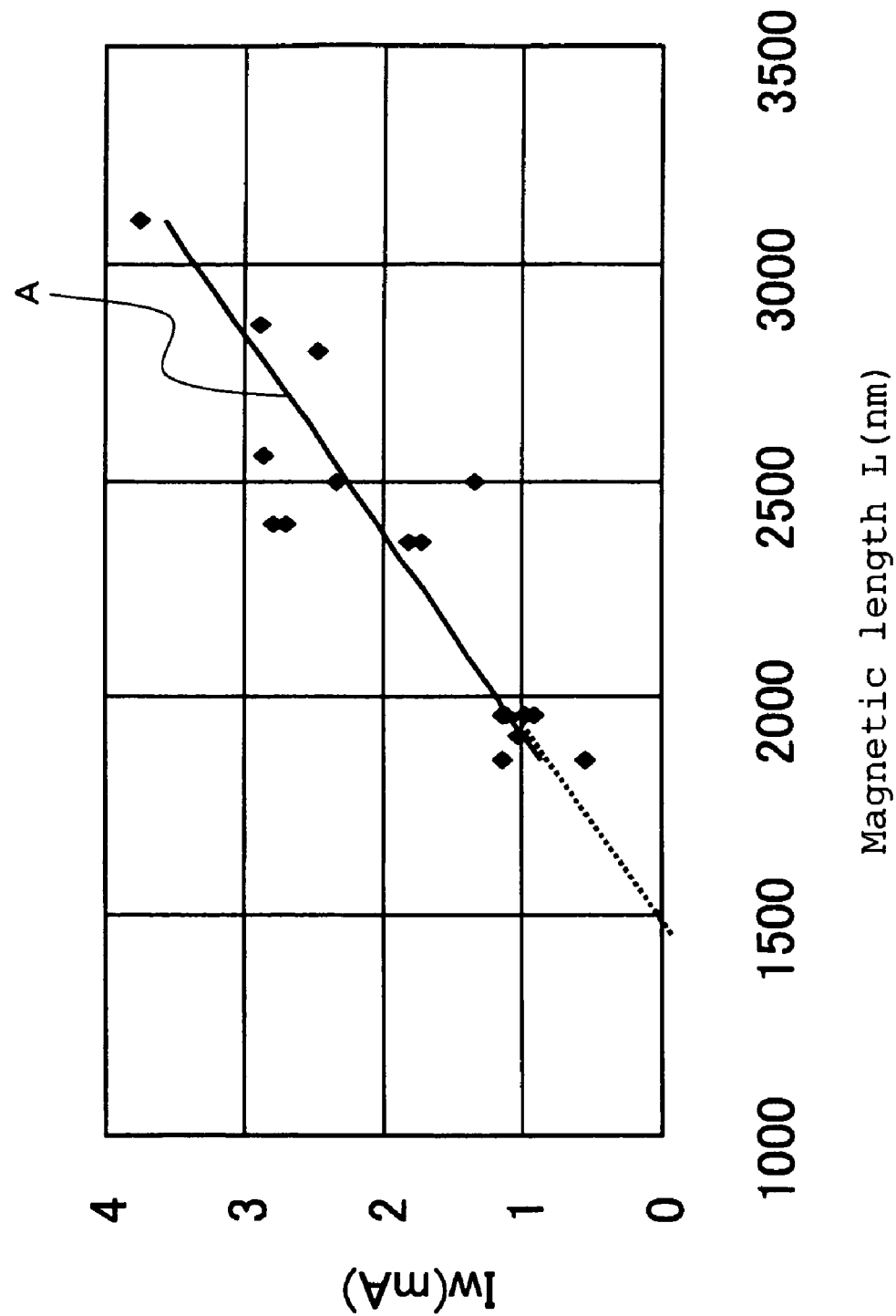
FIG. 10 is a graph showing the result of analysis on the relationship between the magnetic length and the write current of the magnetic storage device.

FIG. 10 shows the result of an analysis of the relationship between the magnetic length of the ferromagnetic yoke 20 and the write current in the magnetic storage device 1 that employs the yoke structure. As is evident from FIG. 10, the shorter the magnetic length of the ferromagnetic yoke 20 is, i.e., the smaller the ferromagnetic yoke 20 is, the smaller the write current is. In the meantime, according to the regression curve A that is obtained from this analysis, a magnetic length of 1500 nm would result in a zero write current. Such a situation is actually impossible, however. That is, the scaling rule does not in fact hold true on analyses that are based on the magnetic length alone, as is the case in FIG. 10.

Figure 11:
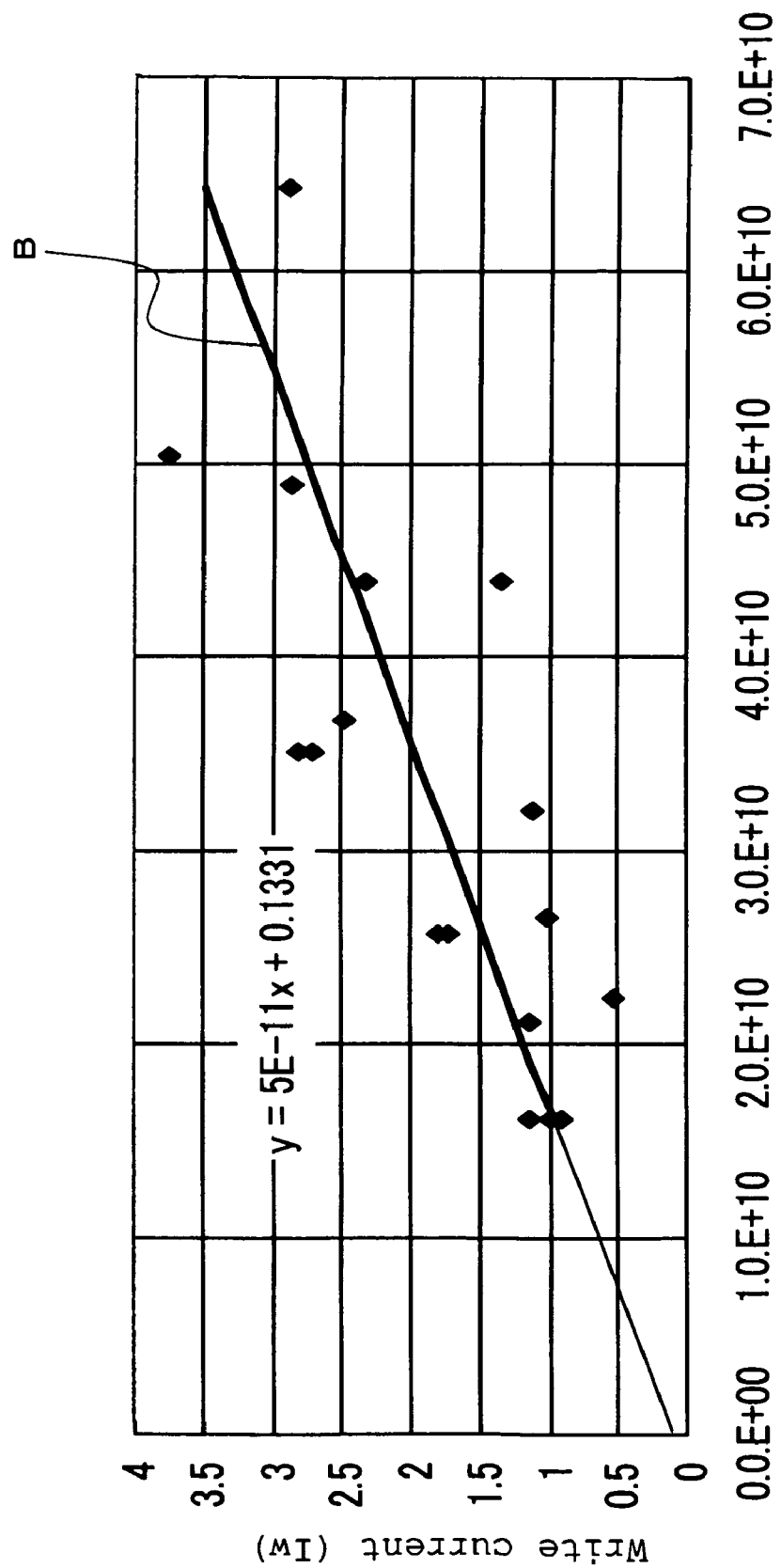
FIG. 11 is a graph showing the result of analysis on the relationship between the magnetoresistance and the write current of the magnetic storage device.

Therefore, taking account of the magnetoresistance R of the ferromagnetic yoke 20, the inventors have conducted an analysis on the relationship between the magnetoresistance R and the write current Iw. FIG. 11 shows the result. As is evident from the graph, the smaller the magnetoresistance R is, the smaller the write current is. An analysis on the regression curve B of FIG. 11 also shows that the magnetoresistance R and the write current I can be converged to near zero. This means that the scaling rule which has been considered to not hold true for the magnetic storage device 1 does in fact hold true, and this rule can be used effectively to achieve power saving with respect to the magnetic storage device.

The theoretical reason why this scaling rule holds is laid out as follows.

Figure 12:
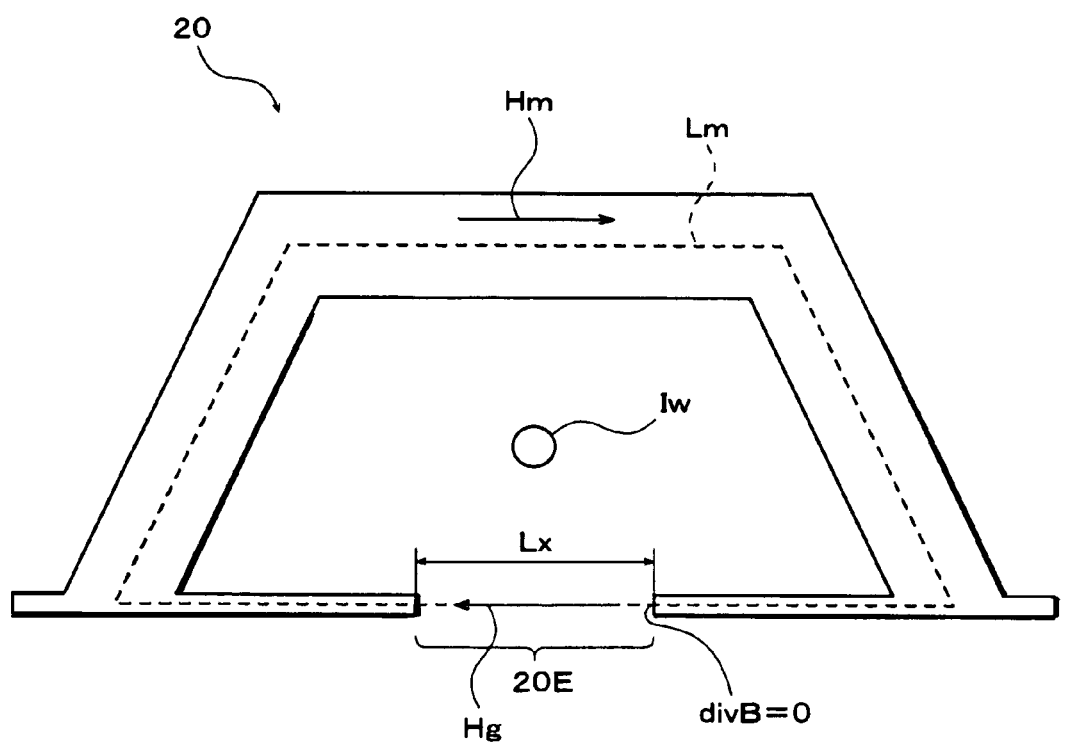
FIG. 12 is a schematic diagram showing a theoretical field of the magnetic storage device with no TMR element.

Consider, initially, the case where the ferromagnetic yoke 20 has a gap 20E in the area where the TMR element 4 is to be arranged as shown in FIG. 12. In this instance, Lm shall be the magnetic length of the ferromagnetic yoke 20, Hm the internal field of the ferromagnetic yoke 20, Lx the length of the gap 20E in the magnetic yoke 20, Hg the field in the gap, and Iw the write current. The gap 20E shall accommodate no object. Using vector analysis formulae, the Maxwell equations are transformed into contour integrations, which are given by the following equations (1). This is because the entire field caused by the write current Iw is confined within the ferromagnetic yoke 20, and the field circulates along the ferromagnetic yoke as long as the ferromagnetic yoke 20 is functioning properly as a magnetic circuit:

$$rot\ H = j \rightarrow Hm^*(Lm-Lx) + Hg^*Lx = Iw,\ div$$
$$B = 0 \rightarrow Hg = M/\mu_0. \qquad (1)$$

Figure 13:
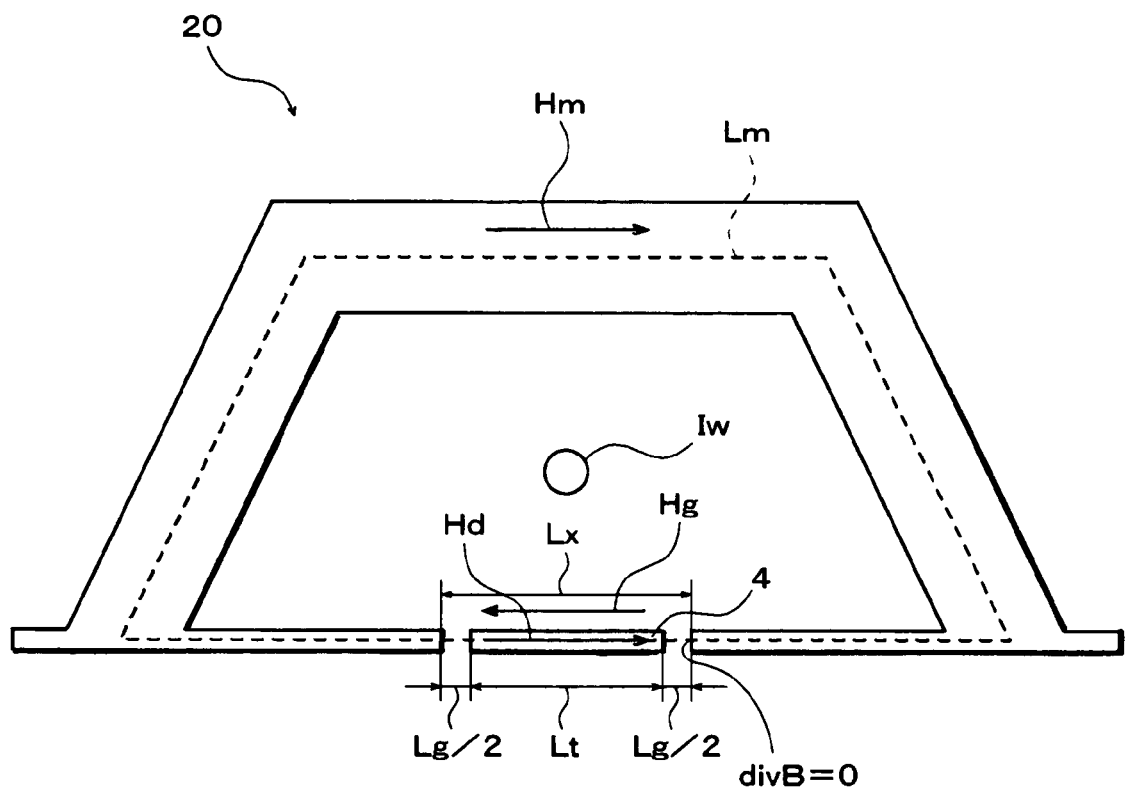
FIG. 13 is a schematic diagram showing the theoretical field of the magnetic storage device in the presence of a TMR element.

Now, consider the case where the TMR element 4 is inserted into the gap 20E of the ferromagnetic yoke 20 as shown in FIG. 13. Lt shall be the length of the TMR element 4, Lg/2 the width of each gap between the ferromagnetic yoke 20 and the TMR element 4, Hg the magnetic field in the gap, Hd the diamagnetic field in the TMR element 4, and Iw the write current. The Maxwell equations then yield the following equations (2). This shows that while the TMR element 4 constitutes part of the magnetic circuit, this TMR element 4 causes a diamagnetic field inside in a direction that is reverse to that of the magnetic path created by the write current Iw:

$$rot\ H = j \rightarrow Hm^*(Lm-Lx) + Hg^*Lg + (Hg-Hd)Lt = Iw,\ div$$
$$B = 0 \rightarrow Hg = M/\mu_0. \qquad Eq.\ (2)$$

That is, given the same write current Iw, a higher field acts on the gap 20E (the TMR element 4) when the TMR element 4 is present in the magnetic circuit than when it is not. Consequently, the TMR element 4 placed in the magnetic circuit of the ferromagnetic yoke 20 intensifies the field by its own presence, and can thus cause a magnetization reversal with a smaller current. In other respects, the TMR element 4 has a relative permeability higher than 1, and thus has a magnetoresistance smaller than that of the air (being the gap 20E itself) in the magnetic circuit. This consequently creates a higher flux density (field*$\mu_0$) for the same current (magnetomotive force). It should be appreciated that this discussion does not hold true when a magnetization reversal is attempted using an external field alone without the provision of the TMR element 4 in the magnetic circuit.

Since Hg=Hm$\mu_s$, the foregoing equations (2) can be transformed through the following equation (3A) into equation (3B):

$$(Hg/\mu_s)^*(Lm-Lx) + Hg^*Lg + (Hg-Hd)Lt = Iw,\ and \qquad Eq.\ (3A)$$

$$Hg\mu_0 S^*\{(Lm-Lx)/(\mu_s\mu_0 S)\} + Hg^*Lg + (Hg-Hd)Lt = Iw, \qquad Eq.\ (3B)$$

where S is the sectional area of the magnetic path.

Since the magnetoresistance R=(Lm−Lx)/($\mu_s\mu_0$S), the foregoing equation (3B) can be further transformed into equation (4):

$$Hg\mu_0 S^*R + Hg^*Lg + (Hg-Hd)Lt = Iw. \qquad Eq.\ (4)$$

From the foregoing, it is possible to derive such a scaling rule as that provided by equation (5):

$$a \cdot R + b = Iw, \qquad Eq.\ (5)$$

where a=Hg$\mu_0$S, and b=Hg*Lg+(Hg−Hd)Lt.

The write current Iw traces a straight line with respect to the magnetoresistance R. The gradient a is equal to the field Hg acting on the TMR element 4, multiplied by the cross-sectional area S of the magnetic circuit and the space permeability $\mu_0$. The smaller the gap widths Lg/2 between the gap 20E and the TMR element 4 and the shorter the length Lt of the TMR element 4, the smaller the intercept b becomes.

Figure 14:
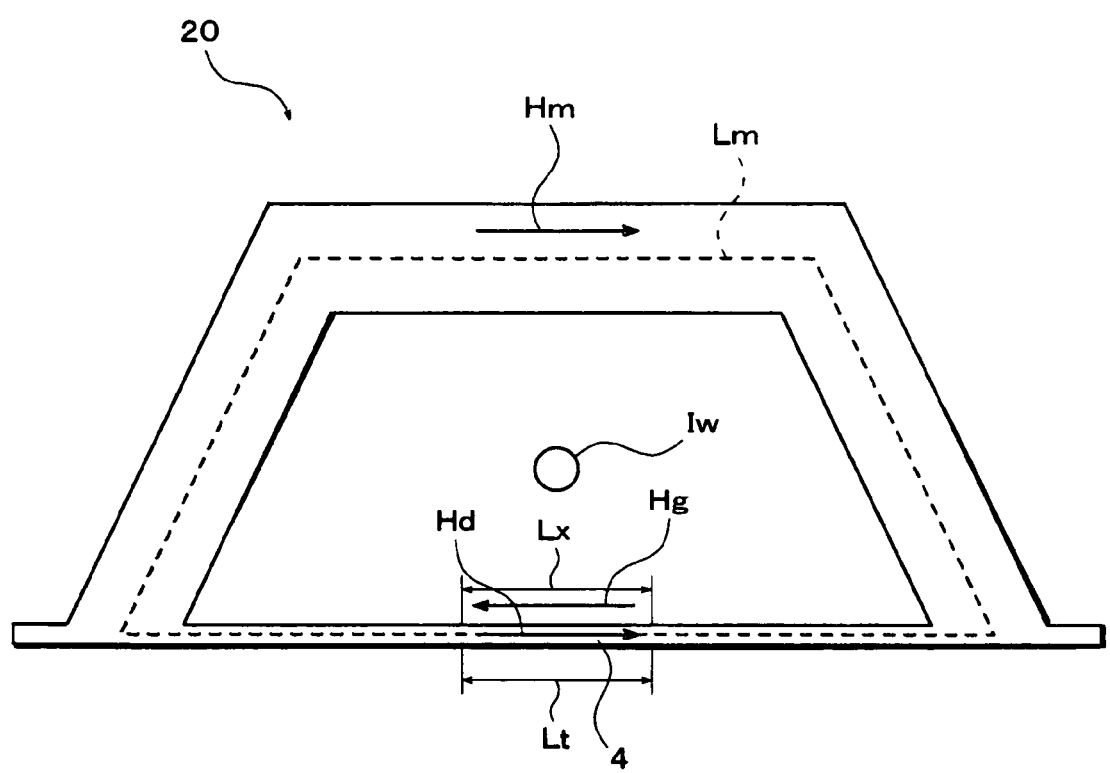
FIG. 14 is a schematic diagram showing the theoretical field of the magnetic storage device with zero gap.

Now, as shown in FIG. 14, the magnetic storage device 1 according to the first embodiment can be considered as having a zero gap width Lg/2 between the ferromagnetic yoke 20 and the TMR element 4. Since the ferromagnetic yoke 20 and the TMR element 4 are integrated, the magnetic circuit of the field is structurally closed by these members. It is therefore possible to consider that Lg=0 and Lt=0, and this condition can be introduced to transform the foregoing equation (5) as follows:

$$a \cdot R = Iw, \qquad Eq.\ (6)$$

where a=Hg$\mu_0$S.

When the TMR element 4 cannot fill the entire gap 20E, the areas of the gap 20E other than the TMR element 4 may be filled with the same ferromagnetic material as that of the ferromagnetic yoke 20. This results in the structure of the magnetic storage device 1 according to the first embodiment. The replacement of the gap 20E with the ferromagnetic material changes the magnetic field of the gap 20E from Hg to Hg', however the scaling rule still holds true in that case.

Consequently, the gradient of the scaling rule becomes smaller as the field Hg (or Hg') passing within the vicinity of the TMR element 4 decreases and the cross-sectional area S of the ferromagnetic yoke 20 (magnetic circuit) decreases. These conditions provide basic guidelines for reducing the write current.

From the foregoing studies, it is theoretically clear that the write current Iw has a linear relationship with the magnetoresistance R in the present embodiment. As previously shown in FIG. 11, the application of the Maxwell equations is also reasonable even in terms of the experiments undertaken.

According to the foregoing discussion, the magnetic storage device 1 of the present embodiment is configured so that the TMR element 4 makes contact with the element side yoke 20A, with a gap length Lg of zero. Since the yoke has a closed magnetic circuit and Lt can be considered to be zero, the write current Iw therefore becomes smaller.

It should be appreciated from the scaling rule of the foregoing equation (6) that the gradient a can be effectively reduced by decreasing the cross-sectional area of the ferromagnetic yoke 20. To enhance the function of the ferromagnetic yoke 20, however, it is preferable to increase the thickness of this ferromagnetic yoke 20. From the viewpoint of the scaling rule according to the present embodiment, however, it is effective to make the cross-sectional area S of the ferromagnetic yoke 20 as small as possible. Accordingly, it is essential to reduce the width (depth) of the ferromagnetic yoke 20 when making the ferromagnetic yoke 20 thicker. This consequently makes the ferromagnetic yoke compact in the planar direction, thereby allowing higher integration of the magnetic storage device 1.

Note that the part of the element side yoke 20A which makes contact with the TMR element 4 is preferably made of a member that makes the passing magnetic field (Hg, Hg') smaller. The smaller Hg lowers both a and b in the foregoing equation (6), thereby reducing the write current.

Figure 15:
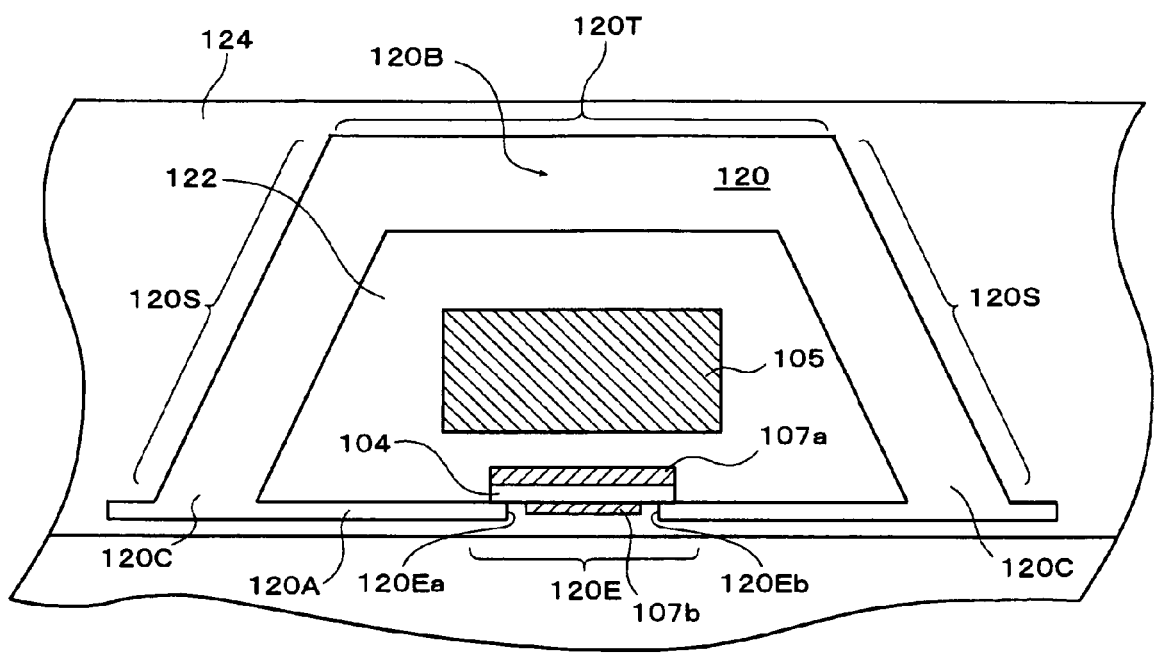
FIG. 15 is an enlarged sectional view showing the structure of a ferromagnetic yoke in the magnetic storage device according to a second embodiment.

FIG. 15 shows a magnetic storage device 101 according to a second embodiment. Parts and components identical or similar to those of the magnetic storage device 1 according to the first embodiment will be designated by reference numerals having the same two lower digits as with this magnetic storage device 1, and a detailed description thereof will be omitted. The following description will deal primarily with differences from the first embodiment.

In this magnetic storage device 101, a ferromagnetic yoke 120 includes an element side yoke 120A and a counter element side yoke 120B. According to the second embodiment, the element side yoke 120A has a gap 120E at the center in particular. A TMR element 104 is arranged so as to bridge the gap 120E. That is, the vicinities of both ends of the TMR element 104 make contact with the vicinities of open ends 120Ea and 120Eb of the element side yoke 120A, respectively. In an axial view, the ferromagnetic yoke 120 itself is shaped to have the open ends 120Ea and 120Eb in part in the circumferential direction. In terms of the magnetic path of the ferromagnetic yoke 120, a closed magnetic circuit is formed by the two magnetic materials of the ferromagnetic yoke 120 and the TMR element 104.

According to this magnetic storage device 101, the gap 120E is formed in the ferromagnetic yoke 120 while this gap 120E is covered by the TMR element 104 which is arranged in contact with the ferromagnetic yoke 120. This makes it possible to concentrate the magnetic field to the TMR element 104.

PRACTICAL EXAMPLES

Figure 17:
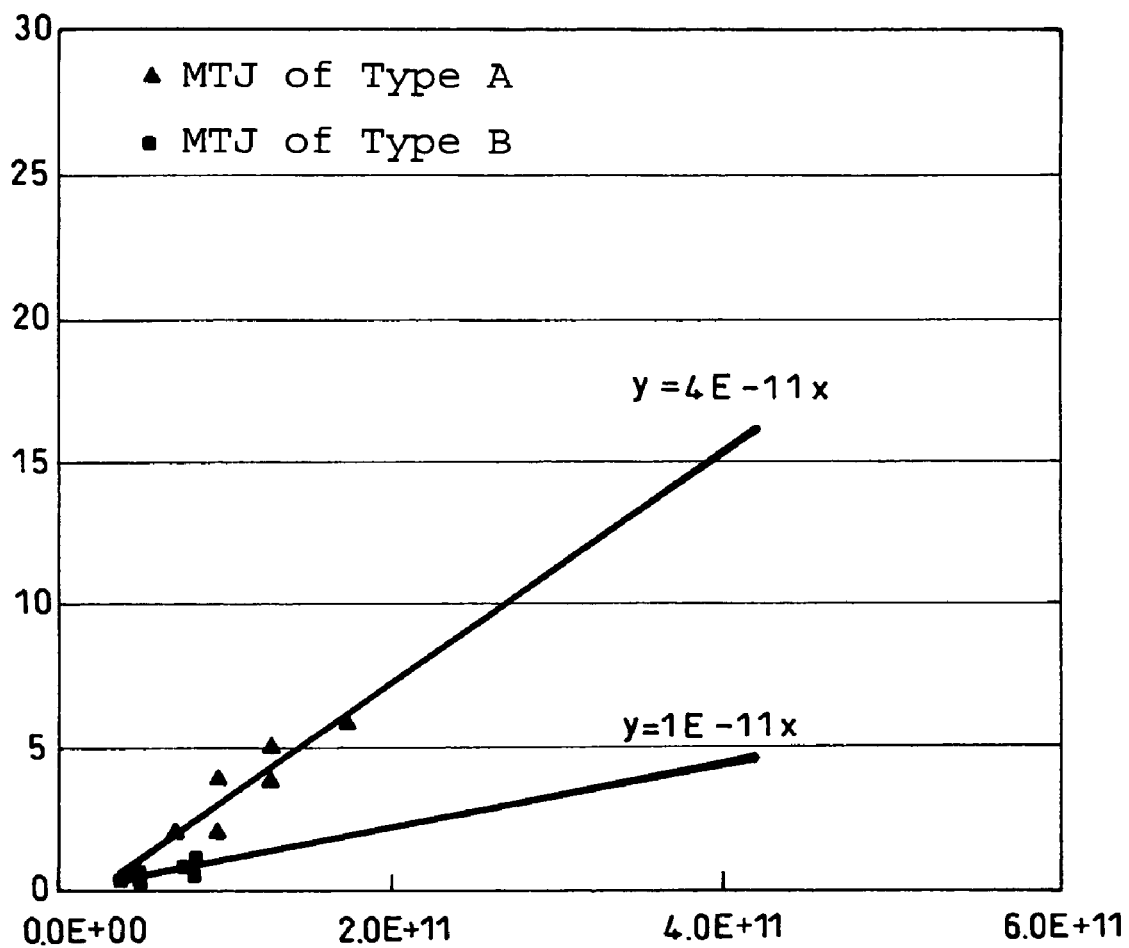
FIG. 17 is a chart showing regression lines based on the result of the analysis on the magnetic storage devices according to the practical examples.

A plurality of magnetic storage devices 1 according to the first embodiment were fabricated as practical examples, and measured for the current value Iw of the write line 5 when writing information to the TMR element 4. In this instance, six devices of type A having roughly similar configurations (A1 to A6) and six devices of type B having roughly similar configurations (B1 to B6) were fabricated. All these magnetic storage devices 1 were designed so that the gradient a derived from $a = Hg\mu_0 S$ satisfied a $(mA \cdot H) \leq 6.0E-11$. FIGS. 16 and 17 show the results. Since the rest of the detailed dimensions of the magnetic storage devices 1 are shown in FIG. 16, description thereof will be omitted.

As can be seen from the graphs, all the devices according to these practical examples showed a write current value Iw as extremely small as 6 mA or less, with a minimum value of around 0.51 mA. That is, power saving has been achieved of the magnetic storage devices 1. The write current also makes smaller changes in value with respect to a change of magnetoresistance. This reduces product-to-product variations in quality (write current value) when mass producing this magnetic storage device 1 of yoke type, thereby facilitating an information write control. It should be appreciated that the regression lines derived from these practical examples (lines which indicate the scaling rule) are such that $Iw(mA) = 4E-11 \times R$ for the magnetic storage devices 1 of type A, and $Iw(mA) = 1E-11 \times R$ for the magnetic storage devices 1 of type B. That is, both types satisfied the foregoing inequality on the gradient a.

COMPARATIVE EXAMPLES

Figure 18:
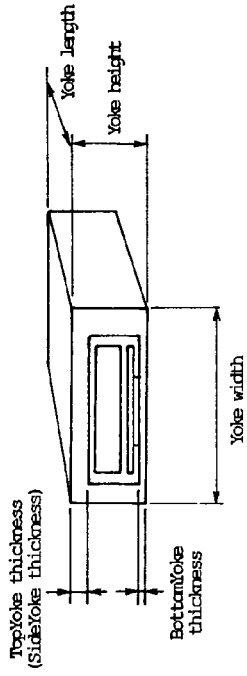
FIG. 18 is a chart showing the result of an analysis on magnetic storage devices according to comparative examples.
Figure 19:
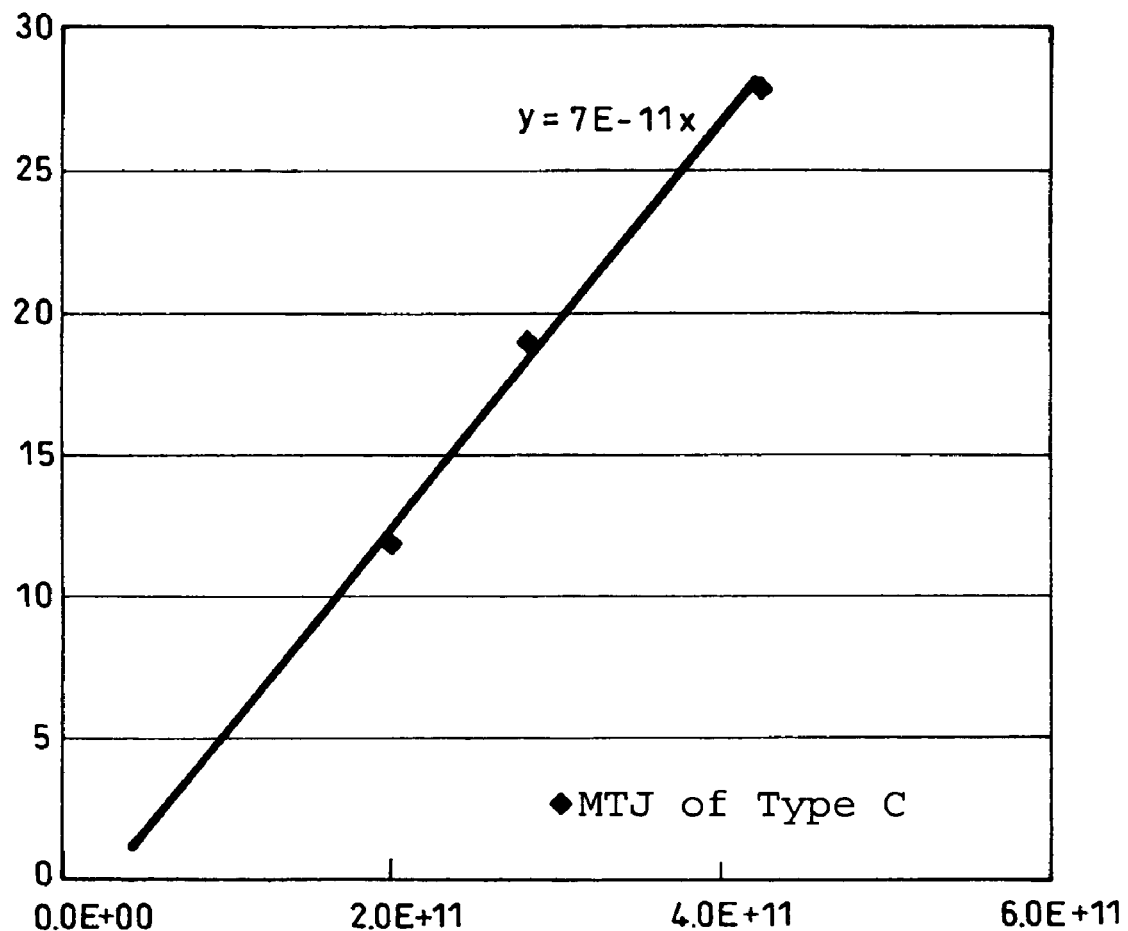
FIG. 19 is a chart showing a regression line based on the result of the analysis on the magnetic storage devices according to the comparative examples.

A plurality of magnetic storage devices having the configuration of type C were similarly fabricated as comparative examples, and measured for the current value Iw of the write line 5 when writing information to the TMR element 4. All these magnetic storage devices 1 were designed so that the gradient a derived from $a = Hg\mu_0 S$ satisfied a $(mA \cdot H) > 6E-11$. FIGS. 18 and 19 show the results. Since the rest of the detailed dimensions of the magnetic storage devices 1 are shown in FIG. 18, a description thereof will be omitted.

As can be seen from the measurements, all the devices according to these comparative examples showed a write current value Iw as large as 10 mA or higher, with a maximum value of around 28 mA. The reason for this seems to be due to the high setting of the gradient a. In such cases, the current value makes large changes with respect to dimensional errors (a change in magnetoresistance) of the ferromagnetic yoke 20. This means poor mass-producibility. The regression line derived from the measurements on these comparative examples of type C (line which indicates the scaling rule) was $Iw(mA) = 7E-11 \times R$.

Up to this point, the magnetic storage devices according to the embodiments have been described. Nevertheless, the present invention is not limited to these embodiments, and various modifications may also be made thereto. For example, while the foregoing embodiments have used TMR elements as the magneto-resistive elements, it is possible to use GMR elements which utilize a giant magneto-resistive (GMR) effect of CPP (Current Perpendicular to Plane) type. The GMR effect refers to a phenomenon that two ferromagnetic layers laminated with a nonmagnetic layer interposed therebetween change in resistance in a direction perpendicular to the direction of lamination depending on the angle between the directions of magnetization of the ferromagnetic layers. More specifically, in GMR elements, the two ferromagnetic layers show minimum resistances when the directions of magnetization of the ferromagnetic layers are parallel with each other. The two ferromagnetic layer show maximum resistances when the directions of magnetization of the ferromagnetic layers are antiparallel to each other. Note that TMR elements and GMR elements can be classified into a pseudo spin valve type and a spin valve type. In the pseudo spin valve type, a difference in coercivity between two ferromagnetic layers is utilized for writing and reading. In the spin valve type, the direction of magnetization of either one of the ferromagnetic layers is fixed by exchange coupling with an antiferromagnetic layer. In order to read data from GMR elements, their ferromagnetic layers are detected for a change in resistance in a direction perpendicular to the direction of lamination. In order to write data on GMR elements, the direction of magnetization of either one of the ferromagnetic layers is inverted using a field caused by a write current.

The foregoing embodiments have dealt with the cases where transistors (read-write transistors) are used as the switching means for controlling the write current and the read current. Nevertheless, this switching means may be practiced by various means having the function of interrupting and passing a current when necessary.

As employed in the second embodiment, the gap made in the element side yoke refers to the final configuration of the ferromagnetic yoke 120. Thus, the element side yoke 120A may be formed in a continuous form before it is cut to make the gap. Otherwise, the pieces of the element side yoke 120A may be formed separately, for example.

It is understood that the magnetic storage device of the present invention is not limited to the foregoing embodiments, and various modifications may be made without departing from the gist of the present invention.

The present invention is applicable to a wide range of fields where various types of information is recorded and retained using magneto-resistive elements.

The entire disclosure of Japanese Patent Application No. 2006-337962 filed on 15 Dec., 2006 including specification, claims, drawings, and summary are incorporated herein by reference in its entirety.

What is claimed is:

1. A magnetic storage device comprising:
   a line;
   a yoke made of a magnetic layer, circumferentially covering part of the line in a longitudinal direction of the line; and a magneto-resistive element arranged in contact with the yoke so as to close a circuit of a magnetic field emanating from the yoke, the magneto-resistive element being capable of writing information using the field, and the line and the yoke are set in a mutually insulated state by an insulator, wherein the device satisfies an equation of $Iw \leq a \cdot Rm$, where Rm (being 1/H) is a magnetoresistance of the yoke, Iw (mA) is a write current necessary for the line, and a (mA·H) =6E−11.

2. The magnetic storage device according to claim 1, further satisfying the equation of $Iw \leq a \cdot Rm$, where Rm (being 1/H) is the magnetoresistance of the yoke, Iw (mA) is the write current necessary for the line, and a (mA·H)=4E−11.

3. The magnetic storage device according to claim 1, wherein the yoke has an annular shape which is completely ringed.

4. The magnetic storage device according to claim 1, wherein the yoke has an annular shape which is completely ringed; and further satisfying the equation of $Iw \leq a \cdot Rm$, where Rm (being 1/H) is the magnetoresistance of the yoke, Iw (mA) is the write current necessary for the line, and a (mA·H)=4E−11.

5. The magnetic storage device according to claim 1, wherein the yoke has a gap, and the magneto-resistive element is arranged to bridge the gap and the vicinities of both ends of the magneto-resistive element make contact with the vicinities of open ends of the yoke.

6. The magnetic storage device according to claim 1, further satisfying the equation of $Iw \leq a \cdot Rm$, where Rm (being 1/H) is the magnetoresistance of the yoke, Iw (mA) is the write current necessary for the line, and a (mA·H)=4E−11; and wherein the yoke has a gap, and the magneto-resistive element is arranged to bridge the gap and the vicinities of both ends of the magneto-resistive element make contact with the vicinities of open ends of the yoke.

7. The magnetic storage device according to claim 1, wherein the yoke comprises:

an element side yoke which is arranged near the line on the magneto-resistive element side; and a counter element side yoke which is arranged near the line on the side opposite to the magneto-resistive element side; and the counter element side yoke further comprises:

a top region located above the line; and inclined regions each positioned on one of the end sides of the top region.

* * * * *